(12) United States Patent
Hara et al.

(10) Patent No.: US 11,056,410 B2
(45) Date of Patent: Jul. 6, 2021

(54) METHOD OF MANUFACTURING SEMICONDUCTOR PACKAGE USING ALIGNMENT MARK ON WAFER

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Sommawan Khumpuang, Tsukuba (JP); Fumito Imura, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 28 days.

(21) Appl. No.: 16/497,283

(22) PCT Filed: Mar. 28, 2018

(86) PCT No.: PCT/JP2018/012931
§ 371 (c)(1),
(2) Date: Sep. 24, 2019

(87) PCT Pub. No.: WO2018/181552
PCT Pub. Date: Oct. 4, 2018

(65) Prior Publication Data
US 2020/0266119 A1    Aug. 20, 2020

(30) Foreign Application Priority Data

Mar. 31, 2017 (JP) ............................. JP2017-071402

(51) Int. Cl.
*H01L 23/12* (2006.01)
*H01L 21/56* (2006.01)
(Continued)

(52) U.S. Cl.
CPC ............ *H01L 23/12* (2013.01); *H01L 21/565* (2013.01); *H01L 21/67703* (2013.01); *H01L 23/544* (2013.01)

(58) Field of Classification Search
CPC combination set(s) only.
See application file for complete search history.

(56) References Cited

U.S. PATENT DOCUMENTS

2003/0015342 A1    1/2003    Sakamoto et al.
2006/0279003 A1    12/2006   Maruyama et al.
(Continued)

FOREIGN PATENT DOCUMENTS

JP    H03-068126 A    3/1991
JP    H11-260768 A    9/1999
(Continued)

OTHER PUBLICATIONS

Apr. 23, 2020 Office Action issued in Japanese Patent Application No. 2019-510023.
(Continued)

*Primary Examiner* — Mamadou L Diallo
(74) *Attorney, Agent, or Firm* — Oliff PLC

(57) ABSTRACT

A method of manufacturing a semiconductor package and a semiconductor package in which positional alignment between a wafer and a substrate until the wafer is mounted and packaged on the substrate is achieved accurately. A wafer is mounted on a package substrate by using first alignment marks and D-cuts as benchmarks, and then a mold resin layer is formed on the wafer in a state in which the first alignment mark is exposed. A part of the mold resin layer is removed by using the D-cuts exposed from the mold resin layer as benchmarks, so that the first alignment marks can be visually recognized. A second alignment marks are formed on the mold resin layer by using the first alignment marks as
(Continued)

benchmarks. A Cu redistribution layer to be conducted to a pad portion is formed on a mold resin layer by using the second alignment marks as benchmarks.

15 Claims, 20 Drawing Sheets

(51) Int. Cl.
   *H01L 21/677* (2006.01)
   *H01L 23/544* (2006.01)

(56) References Cited

U.S. PATENT DOCUMENTS

| | | | |
|---|---|---|---|
| 2009/0026636 A1 | 1/2009 | Murai et al. | |
| 2009/0075422 A1* | 3/2009 | Machida | G03F 9/7076 438/106 |
| 2009/0180185 A1* | 7/2009 | Hayashi | G02B 5/1852 359/566 |
| 2012/0056315 A1* | 3/2012 | Chang | H01L 21/76898 257/737 |
| 2013/0167339 A1 | 7/2013 | Hara et al. | |
| 2017/0133345 A1* | 5/2017 | Knickerbocker | H01L 24/94 |
| 2018/0182713 A1* | 6/2018 | Shiba | H01L 22/12 |
| 2019/0393067 A1* | 12/2019 | Wang | G01B 11/14 |

FOREIGN PATENT DOCUMENTS

| | | |
|---|---|---|
| JP | 2001-144197 A | 5/2001 |
| JP | 2001-332863 A | 11/2001 |
| JP | 2009-032720 A | 2/2009 |
| JP | 2012-104757 A | 5/2012 |
| JP | 2014-240531 A | 12/2014 |
| WO | 2012/029775 A1 | 3/2012 |

OTHER PUBLICATIONS

Mar. 26, 2018 Written Opinion issued in International Application No. PCT/JP2018/012931.

Jun. 26, 2018 International Search Report issued in International Application No. PCT/JP2018/012931.

* cited by examiner

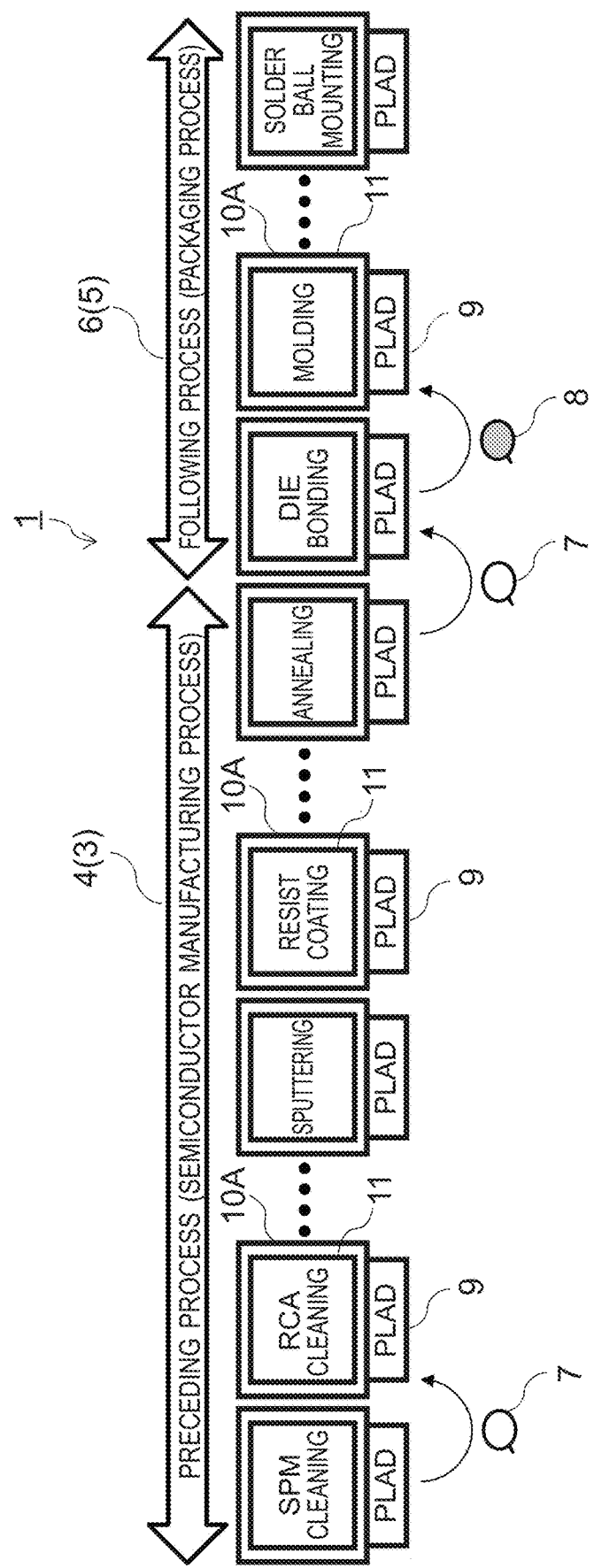

METHOD OF MANUFACTURING SEMICONDUCTOR PACKAGE USING ALIGNMENT MARK ON WAFER

TECHNICAL FIELD

The present invention relates to a method of manufacturing a semiconductor package and a semiconductor package for mounting and packaging a wafer on a substrate.

BACKGROUND ART

In recent years, there has been proposed a minimal fabrication system which is based on making 1 devices on a wafer having a size of 0.5 inches (half inch size) as a manufacturing line for semiconductor devices. In order to do so, a plurality of unit processing apparatuses constitutes a manufacturing process, and the plurality of unit processing apparatuses are configured to be easily repositioned in a flow shop or a job shop so that extremely small-quantity production and multi-product production are supported (see, for example, Patent Literature 1).

In a minimal fabrication system, a preceding process-following process integrated system for mounting and packaging a wafer having a size of 0.5 inches (a disk shape having an outer diameter of 12.5 mm) provided with a semiconductor manufactured thereon by using a plurality of unit processing apparatuses on a disk-shaped package substrate having an outer diameter of 13.5 mm by means of a unit processing apparatus having the same outer shape is proposed (for example, refer to Patent Literature 2).

CITATION LIST

Patent Literature

Patent Literature 1: International Publication No. WO 2012/029775.
Patent Literature 2: National Publication of International Patent Application No. 2014-240531

SUMMARY OF THE INVENTION

Technical Problem

In the technique described in Patent Literature 2 described above, in so-called preceding process until formation of a semiconductor chip by manufacturing a semiconductor on a wafer, positional alignment is performed by using alignment marks formed on the wafer. However, in a so-called following process until formation of a semiconductor package by mounting the semiconductor chip manufactured by the preceding process on a package substrate, an alignment mark formed on a wafer is covered with a mold resin layer. Therefore, positional alignment when forming an electrode layer or a solder ball on the semiconductor is not easy.

Accordingly, it is an object of the present invention to provide a method of manufacturing a semiconductor package and a semiconductor package in which positional alignment between a wafer and a substrate until mounting and packaging a wafer on a substrate can be accurately performed.

Solution to Problem

In order to achieve the above object, the present invention provides a method of manufacturing a semiconductor package for packaging a wafer including a first alignment mark and a pad portion formed on an upper surface thereof on a substrate having a larger outer shape than the wafer and including a positioning portion for positional alignment at an outer edge, the method including: a mounting step of mounting the wafer on the substrate by using the first alignment mark and the positioning portion as benchmarks; a resin layer forming step of forming a resin layer on the wafer in a state where the positioning portion is exposed; a removing step of removing a part of resin layer by using the positioning portion exposed from the resin layer as a benchmark to make the first alignment mark visually recognizable; a mark forming step of forming a second alignment mark on the resin layer by using the first alignment mark as a benchmark; and a wiring pattern forming step of forming a wiring pattern to be conducted to the pad portion on the resin layer by using the second alignment mark as a benchmark.

According to the present invention configured as described above, since a part of a resin layer covering the wafer is removed to make the first alignment mark visually recognizable, the second alignment mark can be formed accurately on the resin layer by using the first alignment mark formed on the wafer in a state before the resin layer is formed as a benchmark. Then, a wiring pattern to be conducted to the pad portion can be formed on the resin layer by using the second alignment mark formed accurately as a benchmark, so that positional alignment until the wafer is mounted and packaged on the substrate is formed accurately.

In order to achieve the above-described object, the present invention provides a method of manufacturing a semiconductor package, in which the wiring pattern forming step includes forming a contact hole for exposing the pad portion on the resin layer by using the first alignment mark as a benchmark, and then forming the wiring pattern to be conducted to the pad portion through the contact hole by using the second alignment mark as a benchmark.

In the present invention configured as described above, since the contact hole exposing the pad portion is formed in the resin layer by using the first alignment mark as a benchmark, the step of forming the contact hole and the step of forming the second alignment mark can be performed in the same step by using the first alignment mark as a benchmark. Accordingly, it is possible to simplify the process of forming the contact hole and the first alignment mark. Further, since the second alignment mark and the contact hole can be formed by using the second alignment mark as a benchmark, the positional relationship between the second alignment mark and the contact hole can be accurately made.

In order to achieve the above object, the present invention provides a method of manufacturing a semiconductor package, wherein the mark forming step and the wiring pattern forming step form the second alignment mark and the contact hole by using a laser light.

In the present invention configured as described above, since formations of the second alignment mark and the contact hole are formed by using a laser light, the second alignment mark and the contact hole can be formed in one laser light irradiation step of scanning over the resin layer by using the first alignment mark as a benchmark.

In order to achieve the above described object, the present invention provides a method of manufacturing a semiconductor package in which the substrate has a disk shape, and the positioning portion is formed by being cut part of an outer periphery of the substrate in a straight line shape.

Since the present invention thus constructed is a positioning portion formed by cutting a part of an outer periphery of a disc-shaped substrate in a straight line shape, the positioning portion is reliably positioned outside the wafer when the wafer is mounted on the substrate. Therefore, positional alignment between the wafer and the substrate with respect to each other by using the positioning portion and the first alignment mark as a benchmark can be performed accurately.

In order to achieve the above object, the present invention provides a method of manufacturing a semiconductor package, in which the wafer has a disk shape with an outer diameter of 12.5 mm, and the substrate has a disk shape having an outer diameter of 13.5 mm.

In the present invention configured as described above, the wafer is formed into a disk shape having an outer diameter of 12.5 mm, and the substrate is formed into a disk shape having an outer diameter of 13.5 mm, thereby forming a wafer and a substrate used in a so-called minimal fabrication system.

In order to achieve the above object, the present invention provides a method of manufacturing a semiconductor package for packaging a plurality of wafers disposed on a base substrate including a first alignment mark and a pad portion formed on an upper surface thereof on a substrate having a larger outer shape than the base substrate and including a positioning portion for positional alignment at an outer edge, the method including: a mounting step of mounting the plurality of wafers on the substrate by using the first alignment mark and the positioning portion of at least one of the plurality of wafers as benchmarks; a resin layer forming step of forming a resin layer on the plurality of wafers in a state where the positioning portion is exposed; a removing step of making the first alignment mark of at least one of the plurality of wafers visually recognizable by removing a part of the resin layer by using the positioning portion exposed from the resin layer as a benchmark; a mark forming step of forming a second alignment mark on the resin layer by using the first alignment mark as a benchmark; and a wiring pattern forming step of forming a wiring pattern to be conducted to the pad portion on the resin layer by using the second alignment mark as a benchmark.

According to the present invention configured as described above, since a part of a resin layer covering at least one of the wafers on a base substrate is removed to make the first alignment mark visually recognizable, the second alignment mark can be formed accurately on the resin layer by using only the first alignment mark formed on any one of the wafers in a state before the resin layer is formed as a benchmark. Then, a wiring pattern to be conducted to the pad portion can be formed on the resin layer by using the second alignment mark formed accurately as a benchmark, so that positional alignment until the plurality of wafers are mounted and packaged on the substrate is formed accurately.

In order to achieve the above object, the present invention provides a semiconductor package including:

a wafer including a pad portion; a first alignment mark formed on an upper surface of the wafer; a substrate including a positional alignment portion for positioning provided on an outer edge thereof and the wafer packaged on an upper surface thereof, and having an outer shape larger than that of the wafer; a resin layer formed on the wafer such that the positioning portion is exposed and the first alignment mark is visually recognizable; a second alignment mark formed on the resin layer; a wiring pattern formed on the resin layer and electrically connected to the pad portion.

According to the present invention configured as described above, the resin layer is formed on the wafer in a state in which the first alignment mark is visually recognizable, so that the second alignment mark can be formed accurately on the resin layer by using the first alignment mark formed on the wafer in a state before the resin layer is formed as a benchmark. Then, a wiring pattern to be conducted to the pad portion can be formed on the resin layer by using the second alignment mark formed accurately as a benchmark, so that positional alignment until the wafer is mounted and packaged on the substrate is formed accurately.

In order to achieve the above described object, the present invention provides a semiconductor package including: a base substrate including a pad portion; a first alignment mark formed on an upper surface of the base substrate; a plurality of wafers disposed on the base substrate; a substrate including a positional alignment portion for positioning provided on an outer edge thereof and the plurality of wafers packaged on an upper surface thereof, and having an outer shape larger than that of the base substrate; a resin layer formed on the plurality of wafers in a state in which the positioning portion is exposed and the first alignment mark of at least one of the plurality of wafers is visually recognizable; a second alignment mark formed on the resin layer; a wiring pattern formed on the resin layer and electrically connected to the pad portion.

According to the present invention configured as described above, since the resin layer is formed on the plurality of wafers in a state in which the first alignment mark of at least any one of the plurality of wafers is visually recognizable, the second alignment mark can be formed accurately on the resin layer by using only the first alignment mark formed on any one of the wafer in a state before the resin layer is formed as a benchmark. Then, a wiring pattern to be conducted to the pad portion can be formed on the resin layer by using the second alignment mark formed accurately as a benchmark, so that positional alignment until the plurality of wafers are mounted and packaged on the substrate is formed accurately.

Advantageous Effect of Invention

According to the present invention, since a part of a resin layer covering the wafer is removed to make the first alignment mark visually recognizable, the second alignment mark can be formed accurately on a resin layer by using the first alignment mark on a wafer as a benchmark. The wiring pattern can be formed on the resin layer with the second alignment mark formed accurately as a benchmark. Positional alignment of the wafer until mounting and packaging on a substrate is accurately achieved.

BRIEF DESCRIPTION OF THE DRAWINGS

FIG. 2 is a schematic diagram showing a unit processing apparatus for preceding and following processes performed in the unit processing apparatus.

DESCRIPTION OF EMBODIMENTS

Embodiments of the present invention will be described below with reference to the drawings.

First Embodiment

Figure 1:
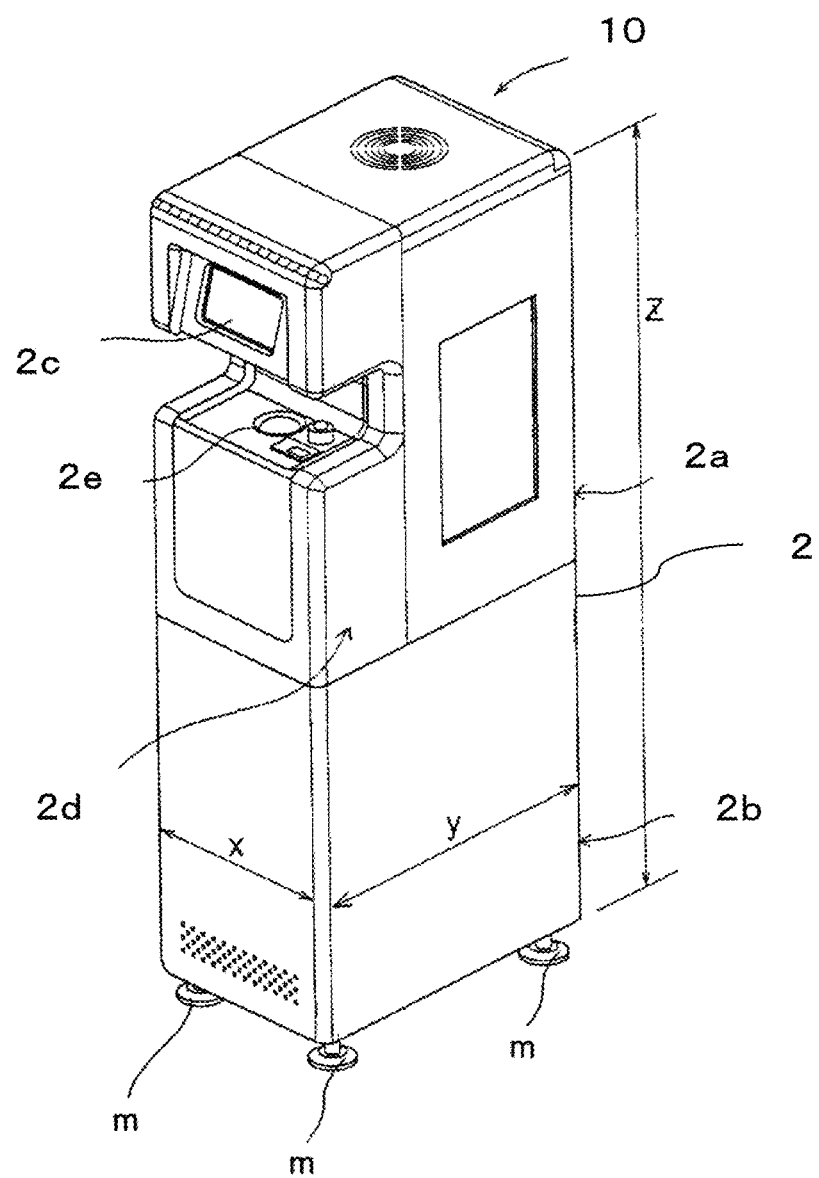
FIG. 1 is an external view of a unit processing apparatus used in a method of manufacturing a semiconductor package according to a first embodiment of the present invention.

A semiconductor manufacturing system 1 for use in a method of manufacturing a semiconductor package according to a first embodiment of the present invention includes, as shown in FIG. 2, a unit processing apparatus group 4 for the preceding process, which constitutes a semiconductor chip manufacturing apparatus 3 for manufacturing a semiconductor A on a wafer W; and a unit processing apparatus group 6 for the following process, which constitutes a semiconductor packaging apparatus 5 forming a semiconductor package P by mounting and packaging a semiconductor chip C manufactured by a semiconductor chip manufacturing apparatus 3 on a package substrate T larger than the wafer W. As shown in FIG. 1 and FIG. 2, the unit processing apparatus groups 4, 6 of the preceding process and the following process are constituted by a plurality of unit processing apparatuses 10 based on a minimal fabrication concept. Here, the minimal fabrication concept is optimal for a semiconductor manufacturing market, so-called high-mix low-volume production, which supports various types of fabrication, which achieve saving resources, saving energy, saving investment and high performance, and realizes a minimal production system which minimizes the production as described in, for example, Japanese Patent Laid-Open No. 2012-54414.

Each unit processing apparatus 10 is provided with a housing 2 having a predetermined size. As shown in FIG. 1, the housing 2 has a substantially rectangular parallelepiped shape which is long in the vertical direction and is unified to the size having a width (x) of 0.30 m×a depth of (y) 0.45 m×a height (z) of 1.44 m, and is configured to block the intrusion of fine particles and gas molecules into the interior thereof. The housing 2 includes an upper apparatus portion 2a and a lower apparatus portion 2b.

As shown in FIG. 2, various processing apparatus main bodies 11 for processing the wafers W are accommodated in the upper apparatus portion 2a. The processing apparatus main bodies 11 are configured such that one processing step necessary for manufacturing the semiconductor A is performed on the wafers W such as etching, exposure and development, and one processing step necessary for packaging the semiconductor chip C to form the semiconductor package P.

An intermediate portion of the upper apparatus portion 2a in the vertical direction is formed in a concave shape in a side view in which the front side of the upper apparatus portion 2a of the apparatus is recessed into the concave shape. An operation panel 2c is attached to the front side of an upper side of the upper apparatus portion 2a. A lower portion in the upper apparatus portion 2a is a front chamber 2d for allowing the wafers W to be carried into the housing 2. A substantially circular docking port 2e serving as a shuttle accommodating portion for installing shuttles 7, 8 serving as a transport container is provided in a substantially central portion of the upper surface of the front chamber 2d.

The front chamber 2d is configured to block the fine particles and gas molecules in the housing 2. In other words, the front chamber 2d houses a Particle Lock Air-tight Docking (PLAD) system 9 as a transport device that allows the wafers W, semiconductor chips C, package substrates T, and the like accommodated in the shuttles 7, 8 to be taken into and out of the housing 2 without being exposed to the outside air. The PLAD system 9 is configured and shaped to be common to all unit processing apparatus 10 that are adapted to the minimal fabrication concept.

The lower apparatus portion 2b accommodates various units used for processing in the processing apparatus main bodies 11. The unit includes a control unit for controlling the processing unit main bodies 11 in the upper apparatus portion 2a, a drug solution tank, a drain tank, and the like used in the processing apparatus main bodies 11. The lower apparatus portion 2b is provided with a supporting portion m for supporting the housing 2.

<Unit Processing Apparatus Group for use in Preceding Process>

The unit processing apparatus group 4 for the preceding process includes a plurality of unit processing apparatuses 10 for manufacturing semiconductor chips C by manufacturing semiconductor A on the surface of a wafers W having a predetermined size standardized in a minimal fabrication concept. Further, the unit processing apparatus group 4 for the preceding process includes the plurality of unit processing apparatuses 10A having different processing steps depending on the type of semiconductor A to be manufactured on the surface of the wafers W.

The wafers W processed by the unit processing apparatus 10A has, for example, a disk-shaped planar surface having an outer diameter of 12.5 mm (half inch size: 0.5 inches), and has a disk shape, for example, an n-type Si substrate having a thickness of 0.25 mm, which is made of single crystal silicon (Si). Each wafers W is accommodated one by one in a shuttle 7 which is a first transfer container for transporting the wafers W.

Further, by fitting the shuttle 7 into the docking port 2e of each unit processing apparatus 10A and starting the processing of each unit processing apparatus 10A, the wafer W housed in the shuttle 7 is taken out from the shuttle 7 by the PLAD system 9, and is carried into a predetermined position in the processing apparatus main body 11. The wafer W after having subjected to the processing by each processing apparatus main body 11 is carried out into the shuttle 7 by the PLAD system 9. Then, the wafer W are transported to the unit processing apparatus 10A in the next step in accordance with the recipe of the semiconductor A to be manufactured on the surface.

<Unit Processing Apparatus Group for Following Process>

The unit processing apparatus group 6 for the following process includes a plurality of unit processing apparatuses 10 which package the semiconductor chips C manufactured by the unit processing apparatus group 4 for the preceding process to form the semiconductor packages P. The unit processing apparatus group 6 for the following process includes a plurality of unit processing apparatuses 10B having different processing steps depending on the type of the semiconductor chip C and the type of the package.

Packaging by the unit processing apparatus 10B is performed by mounting the semiconductor chip C on a disk shaped package substrate T having an outer diameter of 13.5 mm, for example, by mounting. Each package substrate T is accommodated one by one in the shuttle 8 which is a second transport container for a following process for transporting the package substrate T or the semiconductor chip C to which the package substrate T is mounted.

Further, the package substrate T is inserted into the docking port 2e of each unit processing apparatus 10B for the following process to start the processing of each unit processing apparatus 10B, whereby the package substrate T accommodated in the shuttle 8 is taken out from the shuttle 8 and carried into a predetermined position within the processing apparatus main body 11 by the PLAD system 9. The package substrate T after having subjected to the processing by the processing apparatus main body 11 is carried out into the shuttle 8 by the PLAD system 9. The semiconductor chip C and the package substrate T are transported to the unit processing apparatus 10B in the next step according to the recipe until the semiconductor chip C is packaged to form the semiconductor package P.

Further, although the unit processing apparatuses 10B for the following process have different types of processing apparatus main bodies 11 depending on the processing, other parts such as the housing 2, the operation panel 2c, the docking port 2e, the PLAD system 9 are configured to be the same as the unit processing apparatus 10A for the preceding process.

<Semiconductor Chip Manufacturing in Preceding Process>

Next, a method of manufacturing the semiconductor chip C by the unit processing apparatus group 4 for the preceding process will be described with reference to FIGS. 2 and 3.

(Wafer Initial Cleaning)

First, as shown in FIG. 2, the wafers W is subjected to SPM cleaning by using a predetermined unit processing apparatus 10A of the unit processing apparatus group 4 for the preceding process, and then is subjected to RCA cleaning by another unit processing apparatus 10A installed adjacent to the unit processing apparatus 10A.

At this time, the wafers W is fitted into the docking port 2e of the predetermined unit processing apparatus 10A in a state in which the wafers W is accommodated in the shuttle 7 for the preceding process and positionally aligned and retained. Then, by starting the processing by the unit processing apparatus 10A, the wafer W is carried out from inside the shuttle 7 into the PLAD system 9. Subsequently, the wafer W is transported to a predetermined position in the processing apparatus main body 11 by the PLAD system 9. After the predetermined processing by the unit processing apparatus 10A is performed, the wafer W placed at a predetermined position in the processing apparatus main body 11 is transferred into and held by the shuttle 7 by the PLAD system 9. Then, by removing the shuttle 7 from the docking port 2e, the wafer W after having subjected to the processing can be taken out from the unit processing apparatus 10A in a state of being accommodated in the shuttle 7. Further, the shuttle 7 is fitted to the docking port 2e of the unit processing apparatus 10A in the next process, and the next step is performed by the unit processing apparatus 10A.

(Alignment Mark Formation)

Figure 3A:
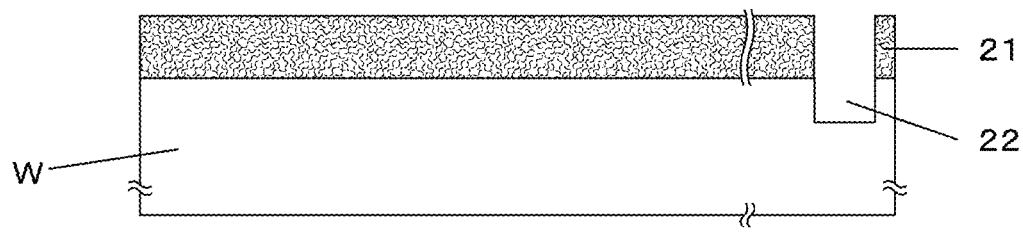
FIG. 3 is a process diagram showing a manufacturing process of manufacturing a semiconductor on a wafer used in the above-described method of manufacturing the semiconductor package, in which (a) is an alignment mark formation, (b) a source and drain formation, (c) a gate oxide film formation, and (d) is an electrode formation.

The wafers W after the RCA cleaning is exposed to light after a resist solution for dry etching is applied to a surface, which is an upper surface thereof. Subsequently, as shown in FIG. 3(a), the wafers W is developed to form a photoresist 21 and patterned, and then Si dry etching is performed to form a first alignment mark 22 on the surface of the wafers W. Subsequently, the photoresist 21 on the wafers W is removed.

(Formation of Source/Drain Impurity Diffused Region)

Figure 3B:
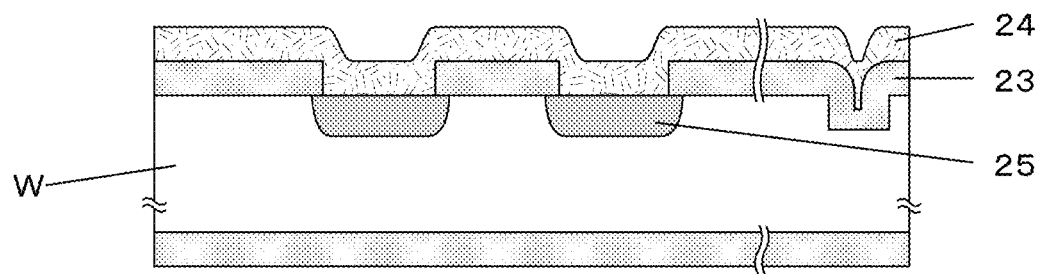

The wafers W on which the first alignment mark 22 is formed is cleaned and then dry oxidized. Subsequently, a resist solution for wet etching is applied to the surface of the wafers W, and then the wafers W is exposed to light, followed by development to form a predetermined resist pattern on the surface of the wafers W. Then, as shown in FIG. 3(b), the wafers W is subject to wet etching of thermal oxide film to form a SiO 2 layer 23. Subsequently, the resist on the wafers W is removed, the wafers W is washed, and then an impurity diffusion agent 24 is applied to the wafer W. The wafers W coated with the impurity diffusion agent 24 is then heat-treated for impurity diffusion to form a diffused region p+25, which corresponds to the source/drain impurity diffused region. Then wet etching is performed to remove the impurity diffusion agent 24.

(Formation of Gate Oxide Film)

Figure 3C:
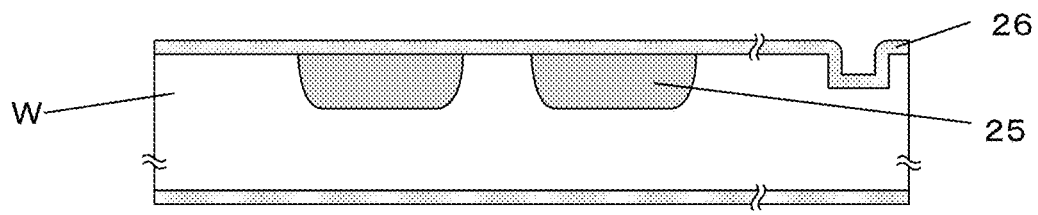

Next, the wafers W on which the source/drain impurity diffused region is formed is cleaned, then dry oxidized, and as shown in FIG. 3(c), a gate oxide film 26 made of SiO 2 is formed on the surface of the wafers W.

(Formation of Gate, Source/Drain Contact)

Figure 3D:
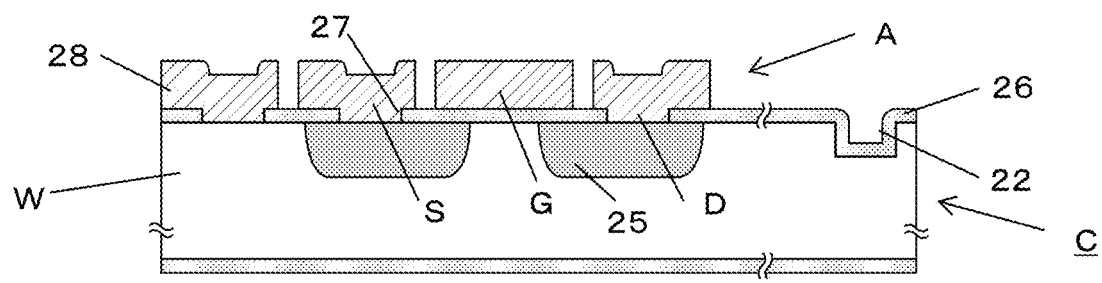

After a resist solution for wet etching is applied to the surface of the wafers W on which the gate oxide film 26 is formed, the surface of the wafers W is exposed to light, developed, to form a resist pattern on the surface of the wafer W. Then, wet etching is performed for the thermal oxide film. Subsequently, as shown in FIG. 3(d), a resist on the wafers W is removed to form a contact hole 27 between the gate and the source or the drain.

(Formation of Al Electrode)

The wafers W having the contact hole 27 formed thereon is cleaned and then aluminum (Al) is sputtered to form an Al layer 28 having a film thickness of, for example, 1 µm or less on the surface of the wafers W. Subsequently, a resist solution for wet etching is applied to the surface of the wafers W, followed by exposure to light, and followed by development to form a predetermined resist pattern on the surface of the Al layer 28. Next, Al wet etching is performed to form a gate electrode G, a source electrode S and a drain electrode D, and then the resist on the wafers W is removed by O2 plasma ashing. Subsequently, the wafers W with the gate electrode G, the source electrode S and the drain electrode D formed thereon is sintered with H2 to achieve H2 sintering. At this time, together with the patterning of the Al layer 28 together with the gate electrode G, the source electrode S and the drain electrode D, the first alignment mark 22 is made visually recognizable by patterning of the Al layer 28.

(Formation of Passivation Film)

Figure 4A:
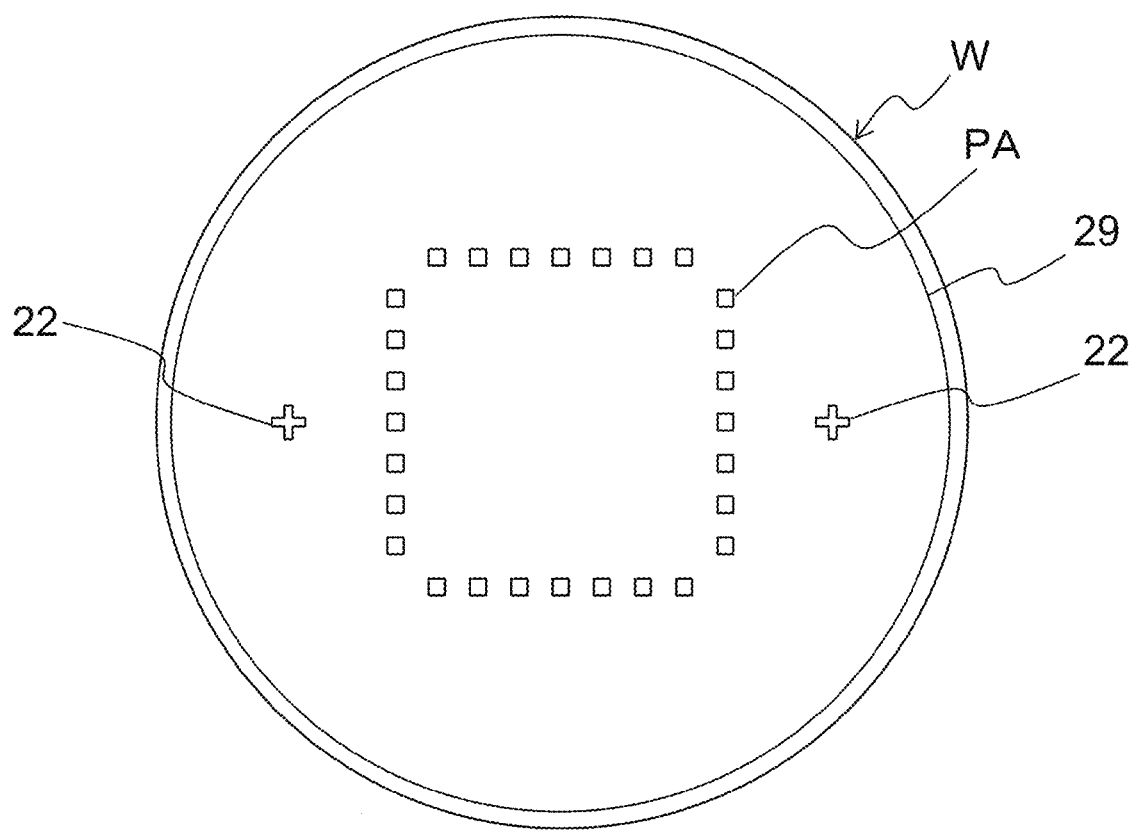
FIG. 4 is a view showing a wafer used in the above-described wafer packaging method, in which (a) is a cross-sectional view, and (b) is a plan view.
Figure 4B:
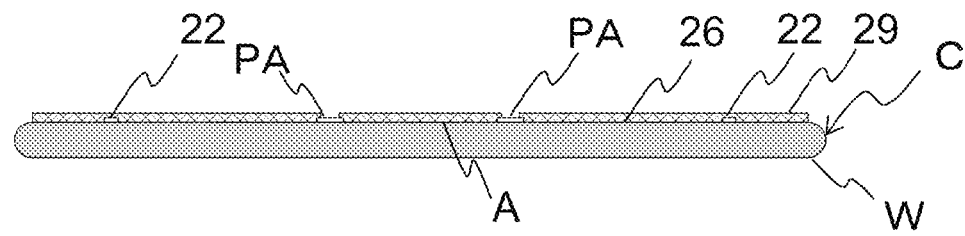

Subsequently, as shown in FIGS. 4(a) and 4(b), a passivation film 29, which is a protective film such as SiN or the like, is formed on the gate oxide film 26, so that a semiconductor chip C having half inch sized outer diameter with the semiconductor A formed on the surface of the wafer W is achieved. The passivation film 29 is provided on the gate oxide film 26 so as to expose a part of the gate electrode G, the source electrode S, and the drain electrode D. Part of the gate electrode G, the source electrode S, and the drain electrode D exposed from the passivation film 29 becomes pad portions PA. As shown in FIG. 4(b), the respective pad portions PA are disposed so as to be spaced apart at equal intervals to form a substantially square shape on an upper surface of the semiconductor chip C. Although the first alignment marks 22 are formed in a concave shape in the wafers W as shown in FIG. 3(d), they are schematically shown on the wafer in FIG. 4(b).

<Semiconductor Package Manufacturing in Following Process>

Next, a method of manufacturing a semiconductor package (wafer packaging method) by the unit processing apparatus group 6 for the following process will be described with reference to FIG. 2 and FIGS. 5 to 14.

(Packaging Substrate)

Figure 5A:
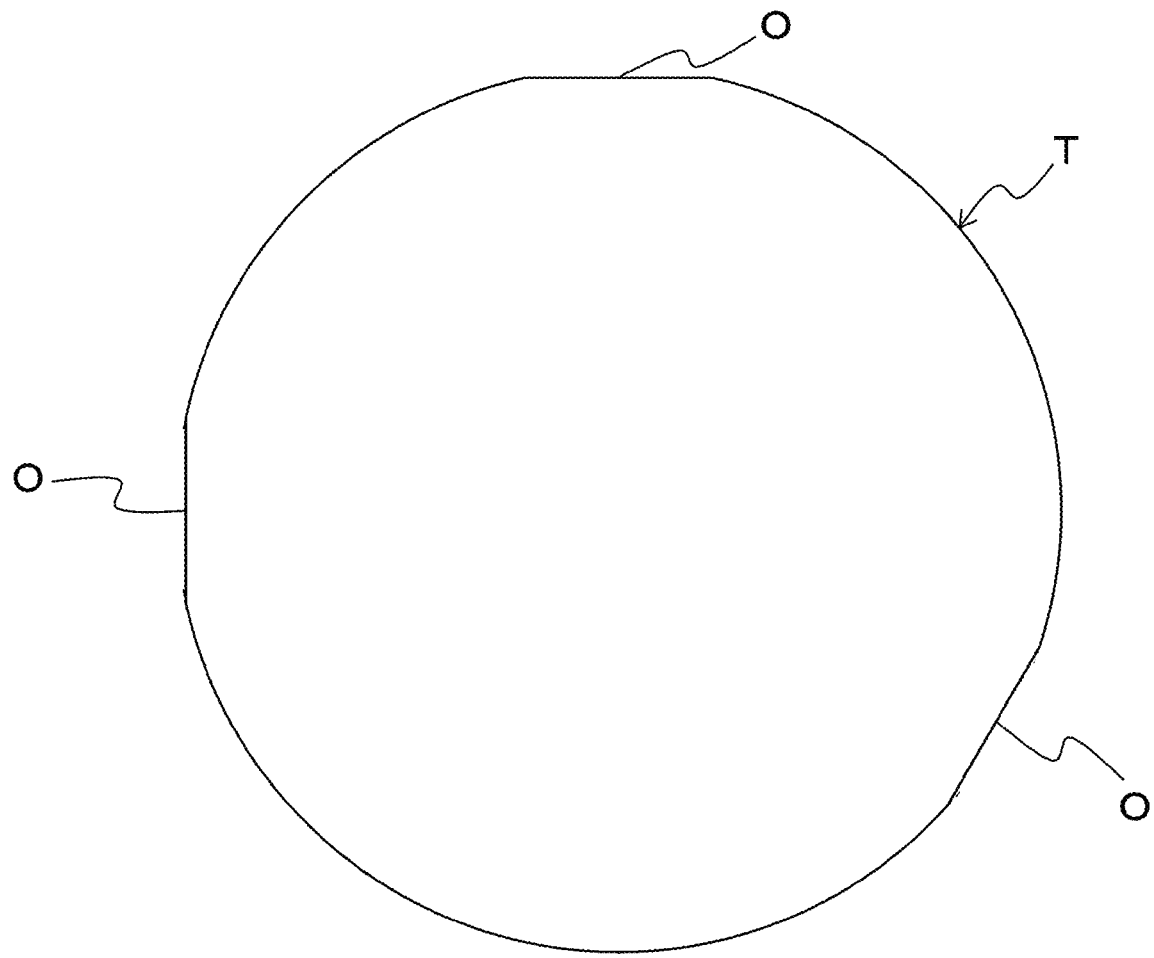
FIG. 5 is a view showing a substrate used in the above-described wafer packaging method, in which (a) is a cross-sectional view, and (b) is a plan view.
Figure 5B:
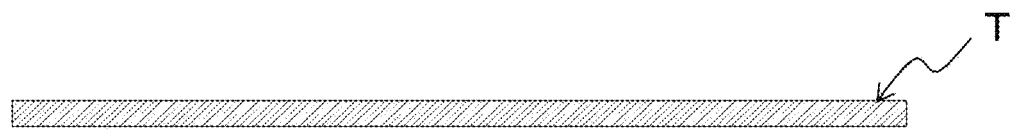

As shown in FIGS. 5(a) and 5(b), the package substrate T is made of a disc-shaped iron nickel alloy (42 alloy) having an outer shape larger than that of the wafers W of a disk shape having, for example, an outer diameter of 13.5 mm and a thickness of 0.2 mm. On an outer edge of a package substrate T, D-cuts O are formed at three points as positioning portions for positional alignment. The D-cuts O are orientation flats formed by cutting a part of the outer periphery of the package substrate T along a straight line. The D-cuts O are formed to provide at positions at an angle of 90° with a center position of the package substrate T as a reference and at a position at an angle of 120° from the center position of either one of the D-cuts O with the center position of the package substrate T as a reference so that the front surface and the back surface of the package substrate T can be distinguished from each other.

Die Attachment (Die Bonding)

Figure 6A:
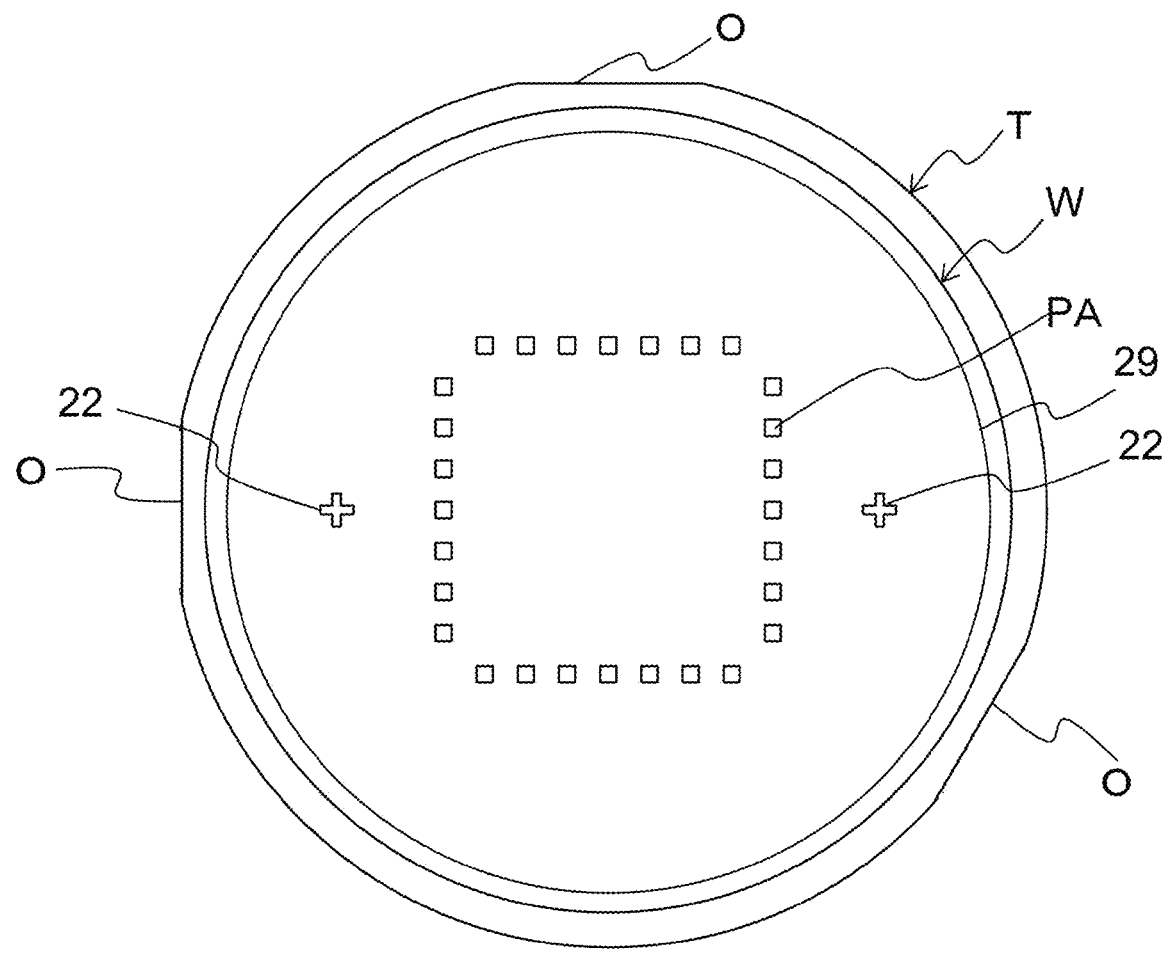
FIG. 6 is a diagram showing a state after a die bonding step in the above-described wafer packaging method, in which (a) is a cross-sectional view, and (b) is a plan view.
Figure 6B:
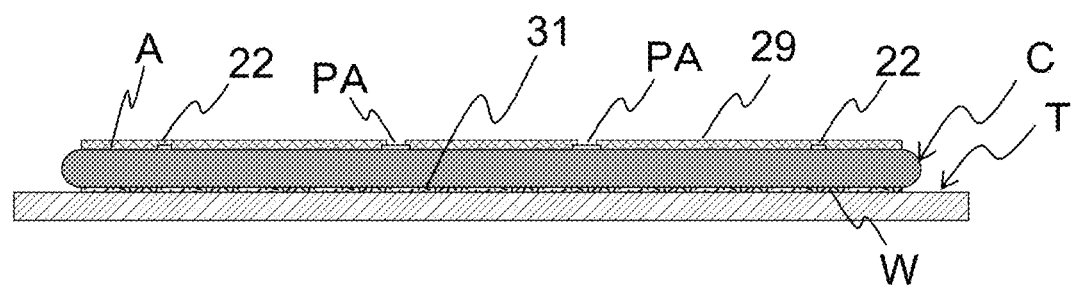

Then, as shown in FIG. 2, predetermined unit processing apparatuses 10B in the unit processing apparatuses 10 for the following process are used, and as shown in FIG. 6(b), an Ag paste 31 is applied to the surface of the package substrate T as means to be adhered to the surface of the package substrate T. In this state, a side of the semiconductor A of the semiconductor chip C is faced up and a lower surface of this semiconductor chip C is placed on and bonded to the Ag paste 31. At this time, as shown in FIG. 6(a), positional alignment between the package substrate T and the semiconductor chip C in the X, Y and θ directions is performed by using the D-cuts O of the package substrate T and the first alignment marks 22 of the semiconductor chip C as benchmarks. Subsequently, the bonded package substrate T and the semiconductor chip C are heated to harden the Ag paste 31, and bond the semiconductor chip C to the package substrate T (mounting step).

At this time, as shown in FIG. 2, the semiconductor chip C is fitted into the docking port 2e of the unit processing apparatus 10B for a predetermined following process in a state in which the semiconductor chip C is accommodated in the shuttle 7 for the preceding process. By starting the processing with the unit processing apparatus 10B in this state, the semiconductor chip C is taken out from the shuttle 7, and is transported to a predetermined position in the processing apparatus main body 11 of the unit processing apparatus 10B. Subsequently, the shuttle 8 for the following process in which the package substrate T is accommodated is fitted to the docking port 2e of the unit processing apparatus 10B, and the processing by the unit processing apparatus 10B is started, so that the package substrate T is taken out from the shuttle 8, and the package substrate T is transported to a predetermined position of the processing apparatus main body 11 of the unit processing apparatus 10B in which the semiconductor chip C is already transported.

In the unit processing apparatus 10B, the package substrate T on which the semiconductor chip C is adhered to the front surface is carried out into the PLAD system 9 from a predetermined position in the processing apparatus main body 11 of the unit processing apparatus 10B and is accommodated in the shuttle 8 fitted to the docking port 2e. Subsequently, the shuttle 8 is removed from the docking port 2e of the unit processing apparatus 10B of the next step, and then the shuttle 8 is fitted to the docking port 2e of the unit processing apparatus 10B in the following process. In the following processes from then onward, the package substrate T after having been processed by the unit processing apparatus 10B is transferred to the unit processing apparatus 10B of the next step in the following process by using the shuttle 8 for the following process.

(Compression Molding)

Figure 7A:
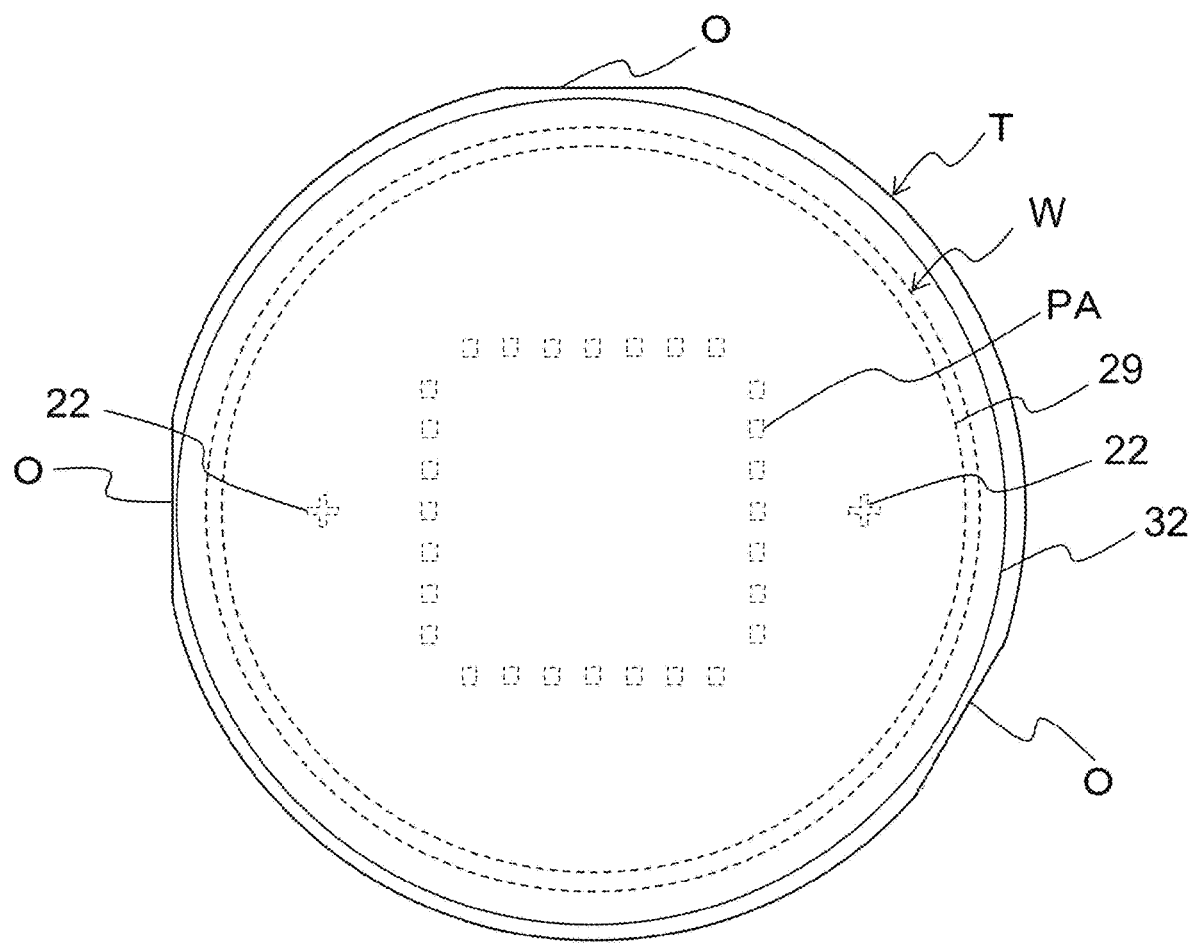
FIG. 7 is a diagram showing a state after the compression molding step in the above-described wafer packaging method described above, in which (a) is a cross-sectional view, and (b) is a plan view.
Figure 7B:
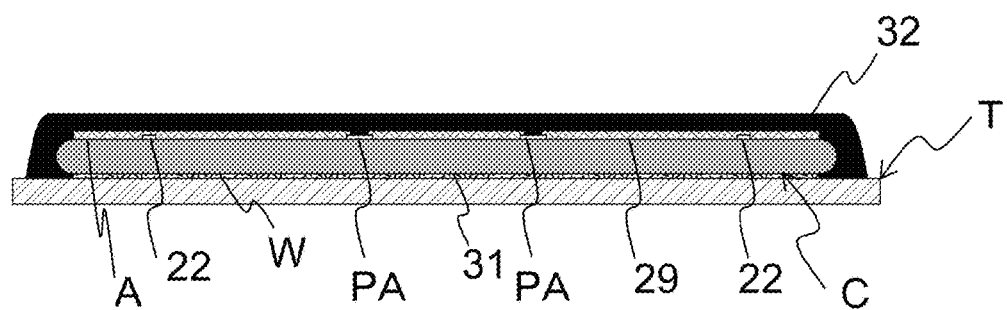

After the mold resin is dropped on and applied to the surface of the semiconductor chip C so as to surround the semiconductor chip C bonded to the package substrate T and make the respective D-cuts O exposed on the surface of the semiconductor chip C, the package substrate T and the semiconductor chip C on which the mold resin is applied are placed in a die, not shown, and compressed and simultaneously heated to form the mold resin layer 32 having, for example, an outer diameter of 12.8 mm, a film thickness of 0.1 mm as shown in FIGS. 7(a) and 7(b) (resin layer forming step). The mold resin layer 32 completely covers the side surface of the semiconductor chip C and the pad portions PA exposed on the surface of the semiconductor chip C, respectively. Moreover, although the mold resin layer 32 exposes the respective D-cuts O, it covers the first alignment marks 22 and the pad portions PA which are formed to be visually recognizable on the surface of the semiconductor chip C so that the first alignment mark 22 and the pad portions PA are invisible.

(First Laser Ablation: Laser Via)

Figure 8A:
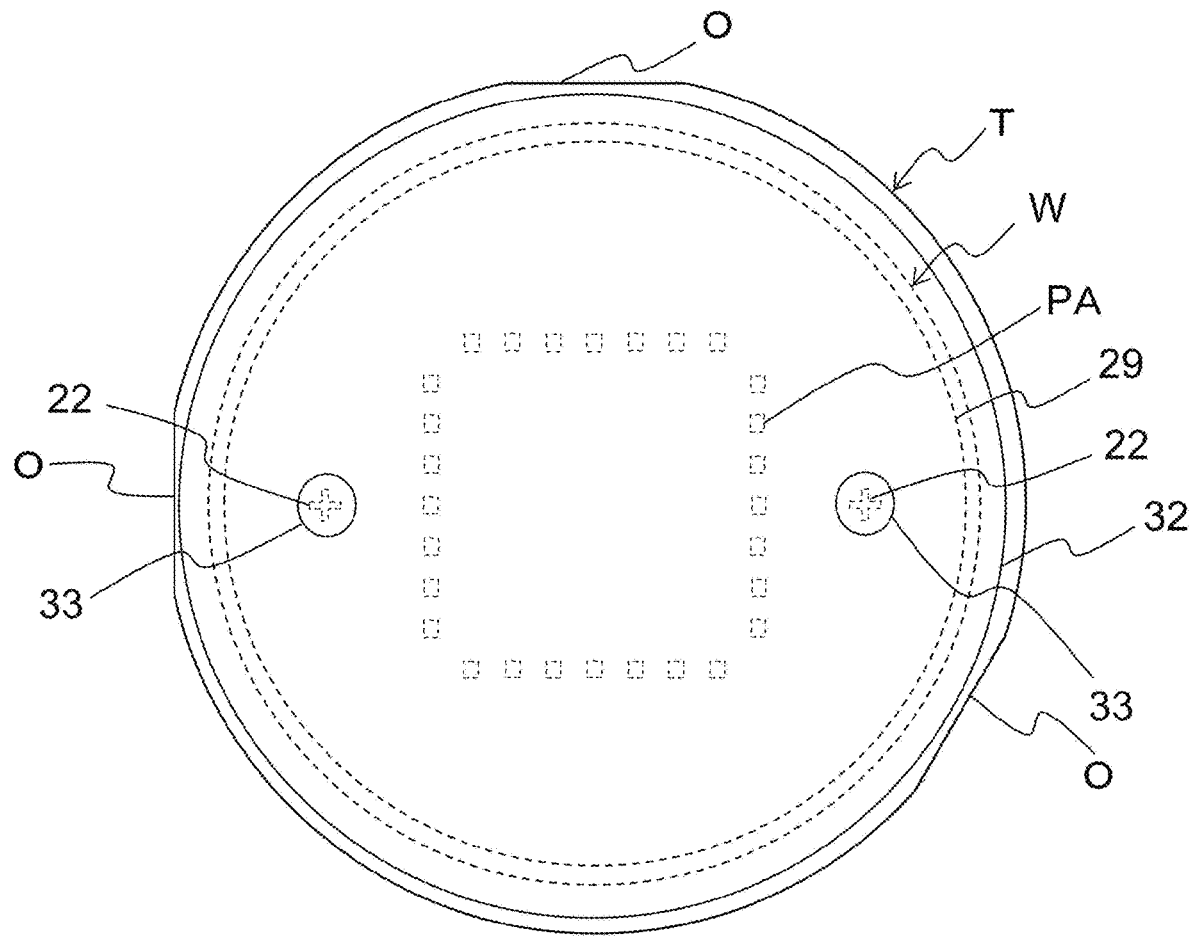
FIG. 8 is a diagram showing a state after a first laser ablation step in the above-described wafer packaging method, in which (a) is a cross-sectional view, and (b) is a plan view.
Figure 8B:
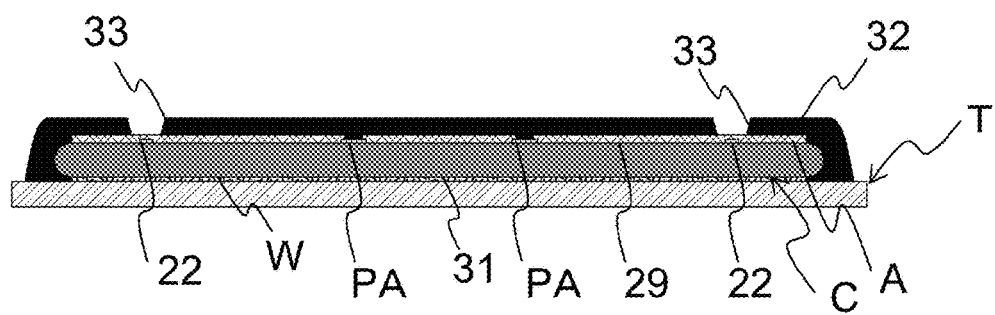

Positional alignment (alignment) in the X, Y and θ directions with respect to the CAD data prepared in advance is performed by using the D-cuts O exposed from the mold resin layer 32 as benchmarks and then laser abrasion for removing the mold resin layer 32 covering the vicinity of the first alignment marks 22 in the mold resin layer 32 on the surface of the semiconductor chip C (removing step). At this time, as shown in FIG. 8(a) and FIG. 8(b), patterning for removing parts of the mold resin layer 32 around the first alignment marks 22 is performed over a range larger than the outer shape of each of the first alignment marks 22 to some extent to make the respective first alignment marks 22 on the surface of the semiconductor chip C visually recognizable. Then, through holes 33 are formed by removing parts of the mold resin layer 32 covering the first alignment marks 22 on the surface of the semiconductor chip C, and these through holes 33 make the first alignment marks 22 visually recognizable from the front surface side of the semiconductor chip C.

(Second Laser Ablation: Laser Via)

Figure 9A:
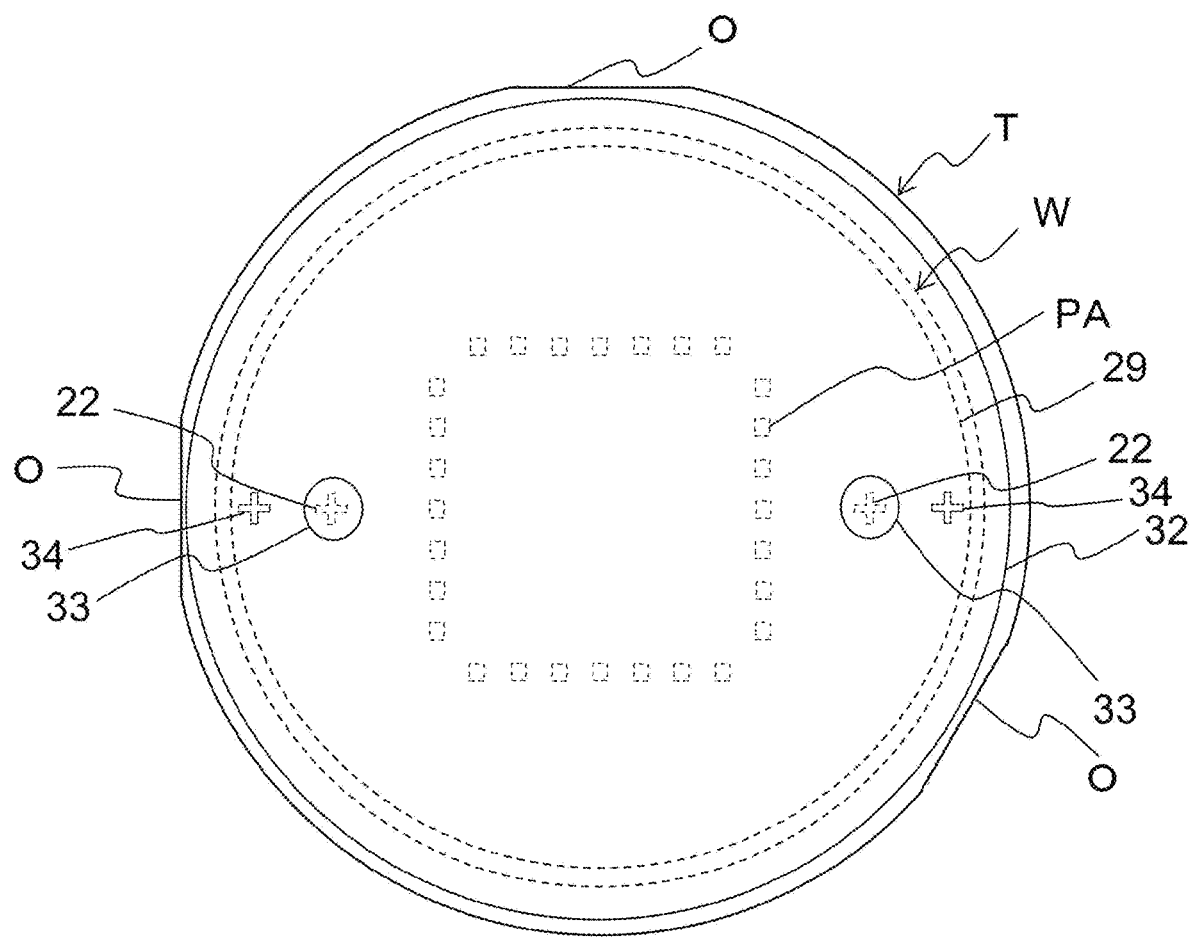
FIG. 9 is a diagram showing a state after a second laser ablation step in the above-described wafer packaging method, in which (a) is a cross-sectional view, and (b) is a plan view.
Figure 9B:
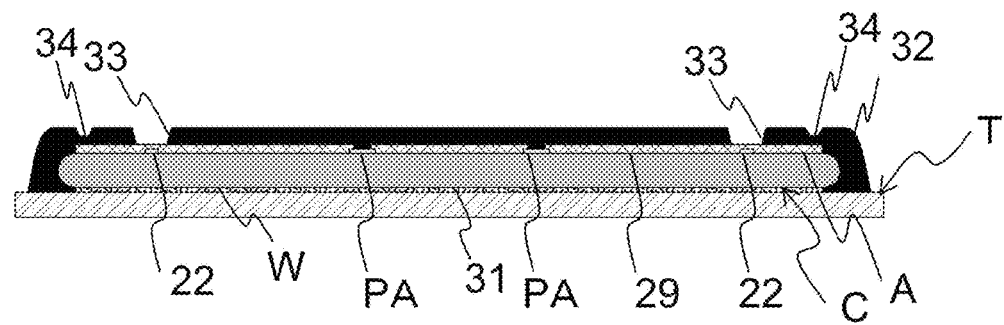

Then, positional alignment in the X, Y and θ directions with respect to the CAD data prepared in advance is performed by using the first alignment marks 22 which are now visually recognizable as benchmarks, and laser ablation for forming the second alignment marks 34 are performed on the mold resin layer 32 on the surface of the semiconductor chip C as shown in FIG. 9(a) and FIG. 9(b) (mark formation step). The second alignment marks 34, being positionally aligned by using the first alignment marks 22 as benchmarks, are formed accurately as compared with the case where the positional alignment is performed by using the D-cuts O as benchmarks.

The second alignment marks 34 are formed at positions outside the semiconductor chip C with respect to the first alignment marks 22 with reference to the center position of the semiconductor chip C. Note that the first alignment marks 22 are visually recognizable by removing a part of the mold resin layer 32, and thus they may become invisible in the processes from this step onward, for example, film forming step and etching step. However, since the second alignment marks 34 are formed in the mold resin layer 32 itself by removing a part of the mold resin layer 32, it is less likely that the second alignment marks 34 become invisible in the process following the current step.

(Third Laser Ablation: Laser Via)

Figure 10A:
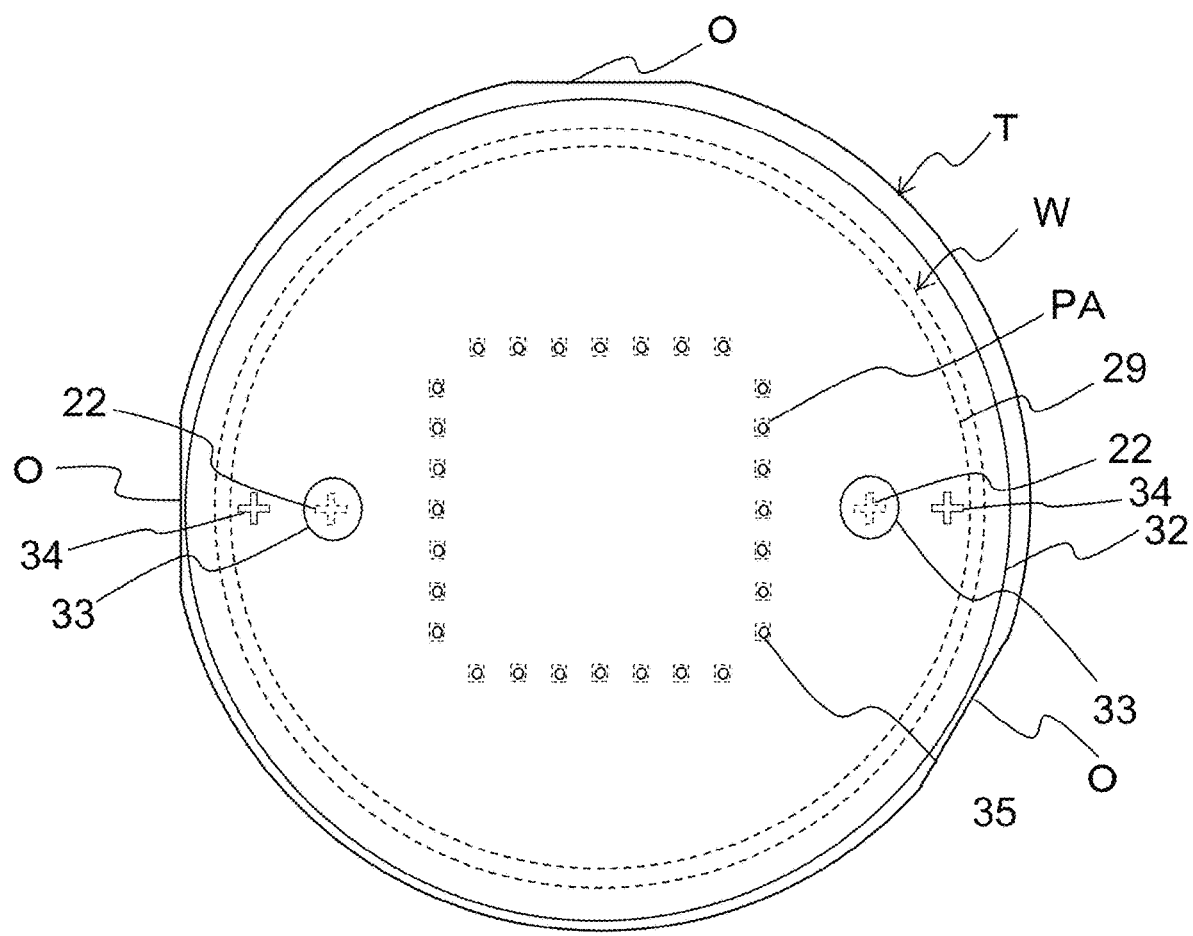
FIG. 10 is a diagram showing a state after a third laser ablation step in the above-described wafer packaging method, in which (a) is a cross-sectional view, and (b) is a plan view.
Figure 10B:
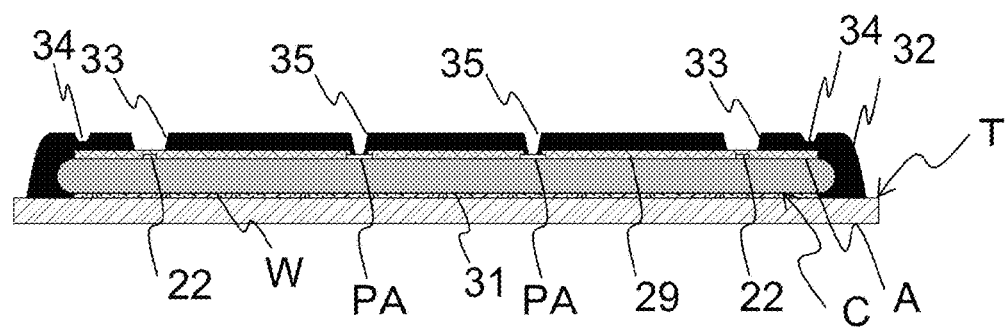

Positional alignment in the X, Y and θ directions with respect to the CAD data prepared in advance is performed by using the first alignment marks 22, which are now visible as benchmarks, and as shown in FIGS. 10(a) and 10(b), laser abrasion for removing a parts of the mold resin layer 32 over the pad portions PA of the mold resin layer 32 on the surface of the semiconductor chip C is performed. As a result, each pad portions PA on the surface of the semiconductor chip C is exposed to the front surface side of the semiconductor chip C by the contact holes 35 formed by removing a part of the mold resin layer 32. As shown in FIG. 10B, the contact holes 35 are formed at predetermined intervals so as to have a substantially square shape in plan view (contact hole forming step).

Here, since positional alignment of the second and third laser ablation may be performed simultaneously by using the first alignment marks 22 as benchmarks, they may be performed simultaneously by a single laser via machining, or the second laser ablation may be performed after the third laser ablation.

(Desmear)

Next, the surface of the semiconductor chip C in which parts of the pad portions PA are exposed by each contact holes 35 is subjected to CCP dry etching to perform plasma cleaning (Desmear).

(Formation of Copper Plating Seed Layer)

Subsequently, copper (Cu) is sputtered on the surface of the semiconductor chip C to form a Cu sputter film having a film thickness of, for example, 0.1 μm, which covers the entire surface of the semiconductor chip C. The Cu sputter film covers the side surfaces of the first and second alignment marks 22, 34 on the semiconductor chip C, the first alignment marks 22 visually recognizable via the through holes 33, the pad portions PA exposed through the contact holes 35, and the second alignment marks 34. Therefore, the Cu sputter film is electrically connected to the respective pad portions PA through the contact holes 35.

(Copper Electroplating)

Figure 11A:
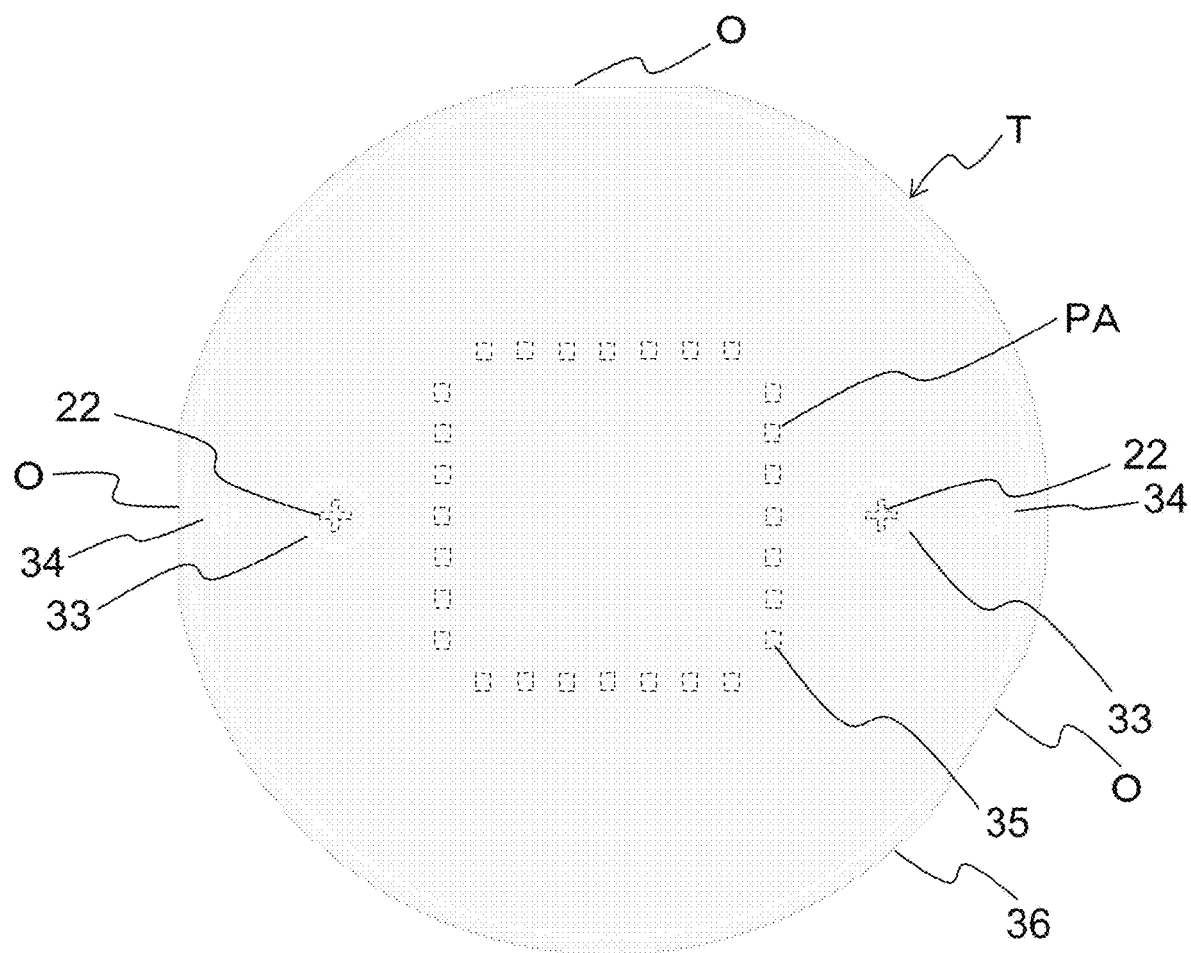
FIG. 11 is a diagram showing a state after a Cu sputtering step and a Cu electroplating step in the above-described wafer packaging method, in which (a) is a cross-sectional view, and (b) is a plan view.
Figure 11B:
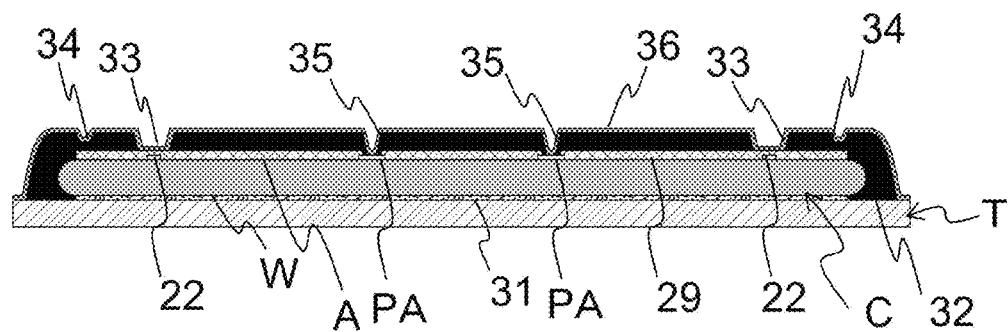

Further, the surface of the semiconductor chip C on which the Cu sputter film is formed is plated with Cu electroplating, and as shown in FIG. 11(a) and FIG. 11(b), a Cu film 36, which is a conductive film having a film thickness of, for example, 3 μm, is formed on the mold resin layer 32. At this time, since the first alignment mark 22 cannot be visually recognizable due to the Cu film 36, the film thickness of the first alignment mark 22 is 1 μm or less and a film thickness of the Cu film 36 is 3 μm, a shoulders formed by the through holes 33 formed to make the first alignment marks 22 visually recognizable become invisible. However, since the second alignment marks 34 are formed in the mold resin layer 32 itself, the shoulders of the second alignment marks 34 is in a visually recognizable state.

(Photolithography)

Figure 12A:
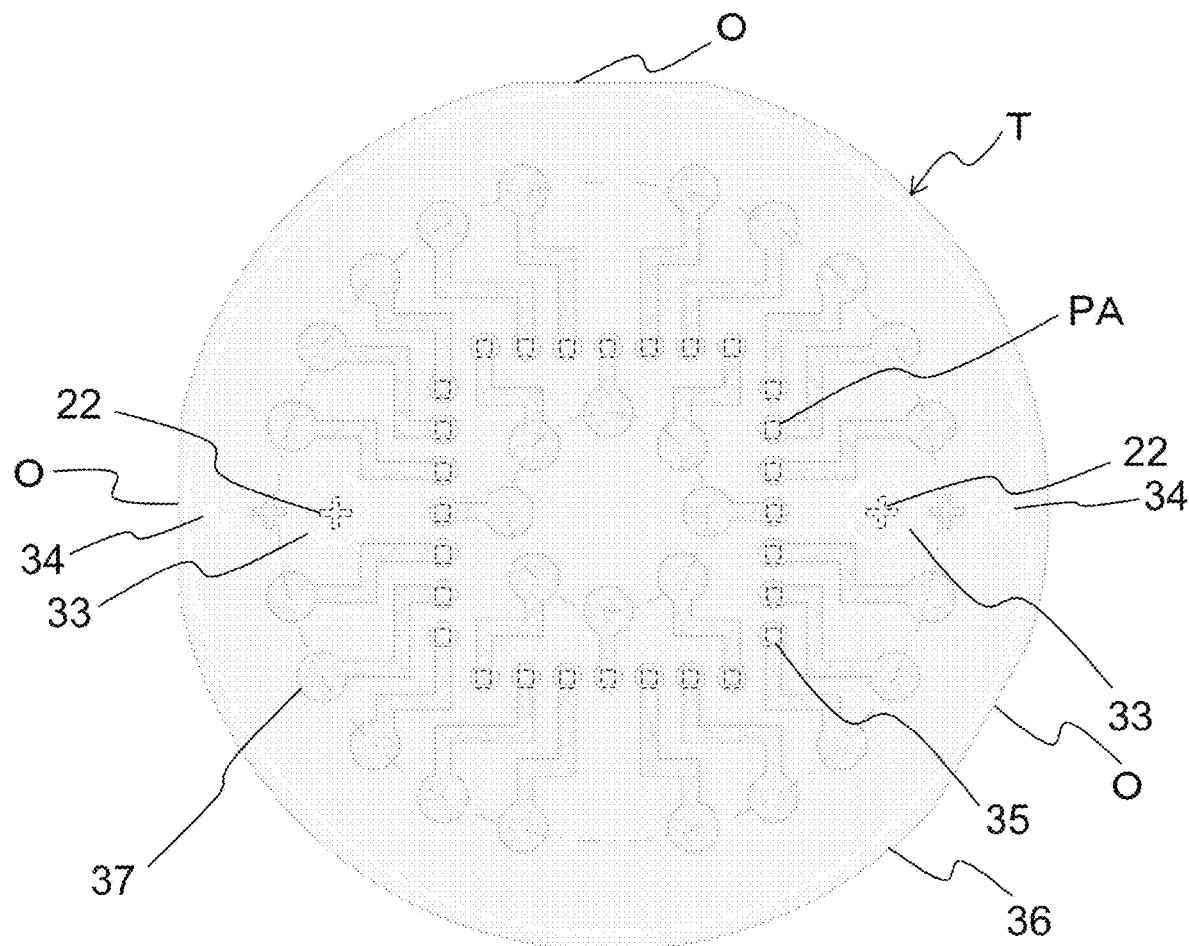
FIG. 12 is a diagram showing a state after a photolithography step of the above-described wafer packaging method, in which (a) is a cross-sectional view, and (b) is a plan view.
Figure 12B:
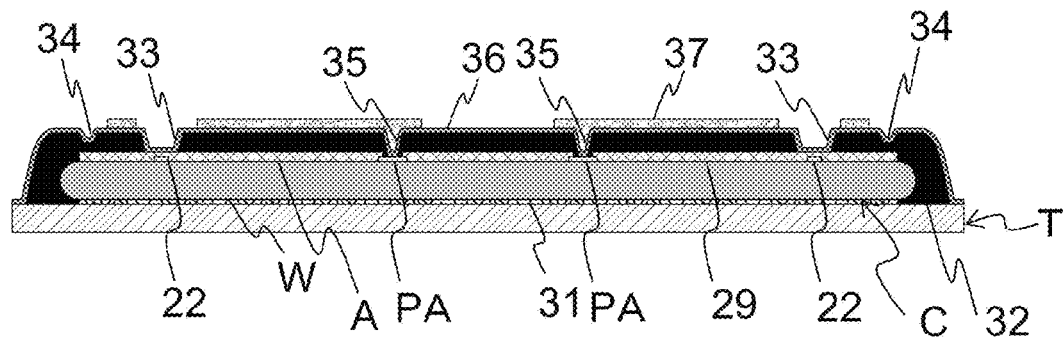

A resist solution for photoresist is applied to the surface of the semiconductor chip C, on which the Cu film 36 is formed, thereby forming a resist film having a film thickness of, for example, 1.0 μm. Then, the semiconductor chip C on which the resist film is formed is subjected to maskless exposure, followed by development, and as shown in FIGS. 12(a) and 12(b), a photoresist 37 having a predetermined pattern is formed on the Cu film 36. The photoresist 37 removes the resist film at the portion of the through holes 33 and the second alignment marks 34. In addition, in the photoresist 37, a part of the resist film on the Cu film 36 between each through holes 33 and the second alignment marks 34 is left, and the Cu film 36 covered by the remaining resist film becomes third alignment marks 38, which will be described later. Further, in the maskless exposure for forming the photoresist 37, since the shoulders of the second alignment marks 34 are visually recognizable through the resist film, positional alignment in the X, Y and θ directions with respect to the CAD data prepared in advance is performed by using the steps of the second alignment marks 34 as benchmarks, and the resist film on the semiconductor chip C is patterned (Pattern Formation Step).

(Etching)

Figure 13A:
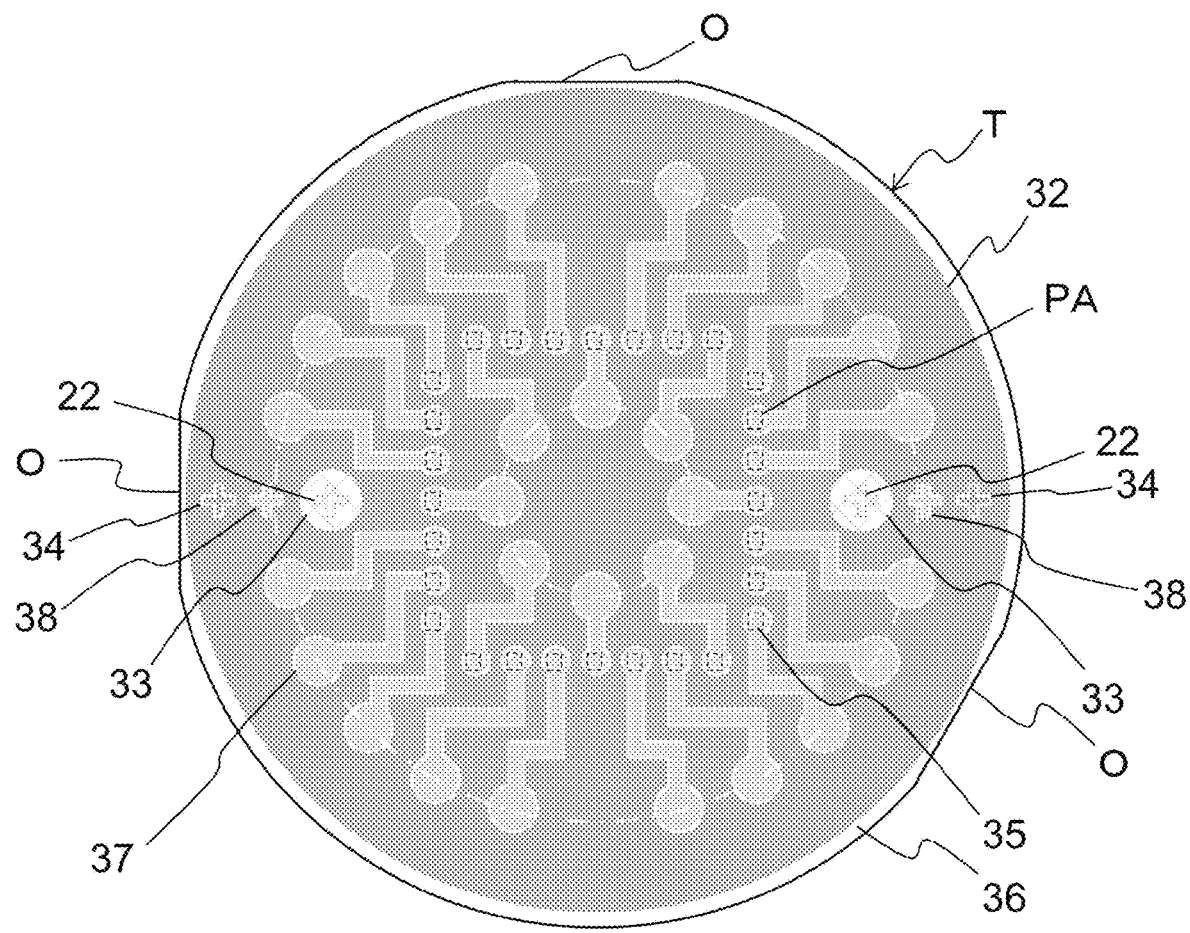
FIG. 13 is a diagram showing a state after a Cu wet etching step of the above-described wafer packaging method, in which (a) is a cross-sectional view, and (b) is a plan view.
Figure 13B:
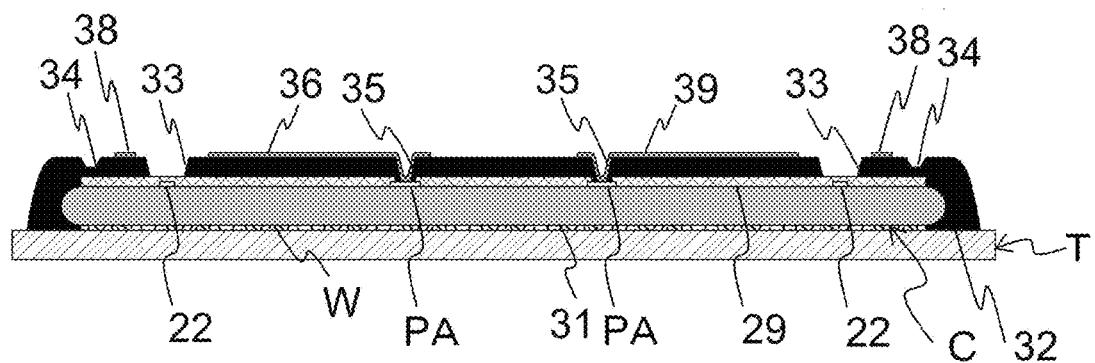

Next, the surface of the semiconductor chip C is subjected to Cu etching using a photoresist 37, the Cu film 36 is patterned, and then the CCP dry etching is performed to remove the photoresist 37, thereby forming a Cu redistribution layer 39 as an electrode layer. At this time, as shown in FIG. 13(a) and FIG. 13(b), since the photoresist 37, which is formed by removing the Cu film 36 covering the through holes 33 and the second alignment marks 34, is used, the first and the second alignment marks 22, 34 are visually recognizable. Further, a part of the Cu redistribution layer 39 formed between the first and second alignment marks 22, 34 and becomes a third alignment marks 38 serving as a positioning portion for the next step (wiring pattern forming step).

(Solder Resist Coating)

Figure 14A:
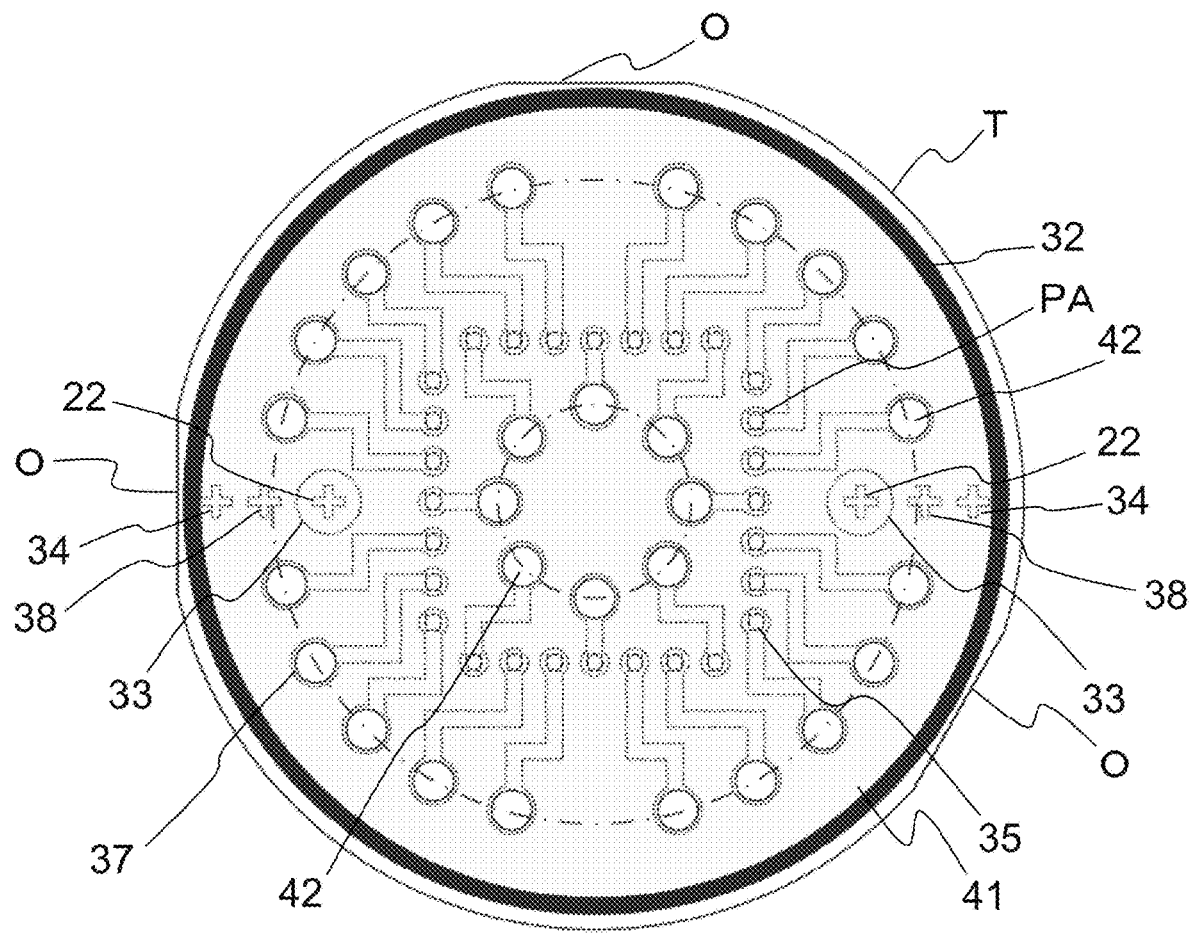
FIG. 14 is a diagram showing a state after a solder resist coating step and a patterning step of the above-described wafer packaging method, in which (a) is a cross-sectional view, and (b) is a plan view.
Figure 14B:
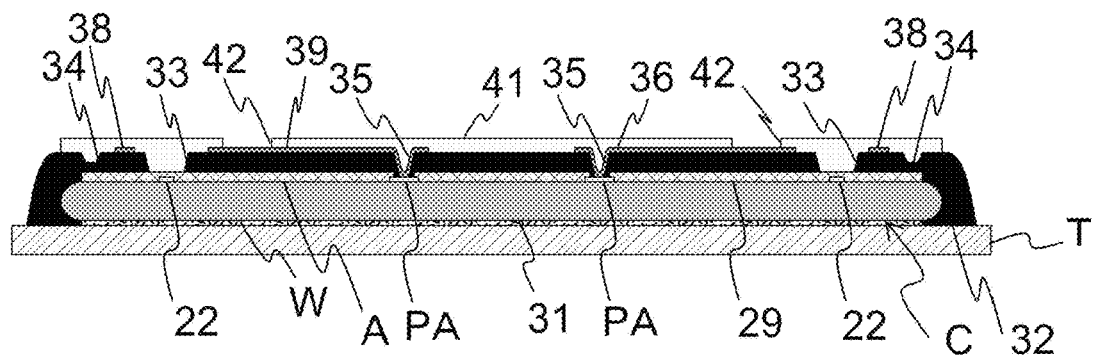

Furthermore, positional alignment in the X, Y and θ directions with respect to the CAD data prepared in advance is performed by using the third alignment marks 38 as benchmarks. Then, as shown in FIGS. 14(a) and 14(b), a solder resist layer 41 having a film thickness of, for example, 30 μm is printed on the surface of the semiconductor chip C on which the Cu redistribution layer 39 is formed as a wiring pattern by an ink jet printer and is cured by ultraviolet (UV) light to form contact holes 42 communicating with the Cu redistribution layer 39 on the solder resist layer 41. At this time, positional alignment of the semiconductor chip C and the CAD data in the X, Y and θ directions may be performed by using the second alignment marks 34 as benchmarks.

(Solder Ball Mounting: Ball Mount)

Figure 15A:
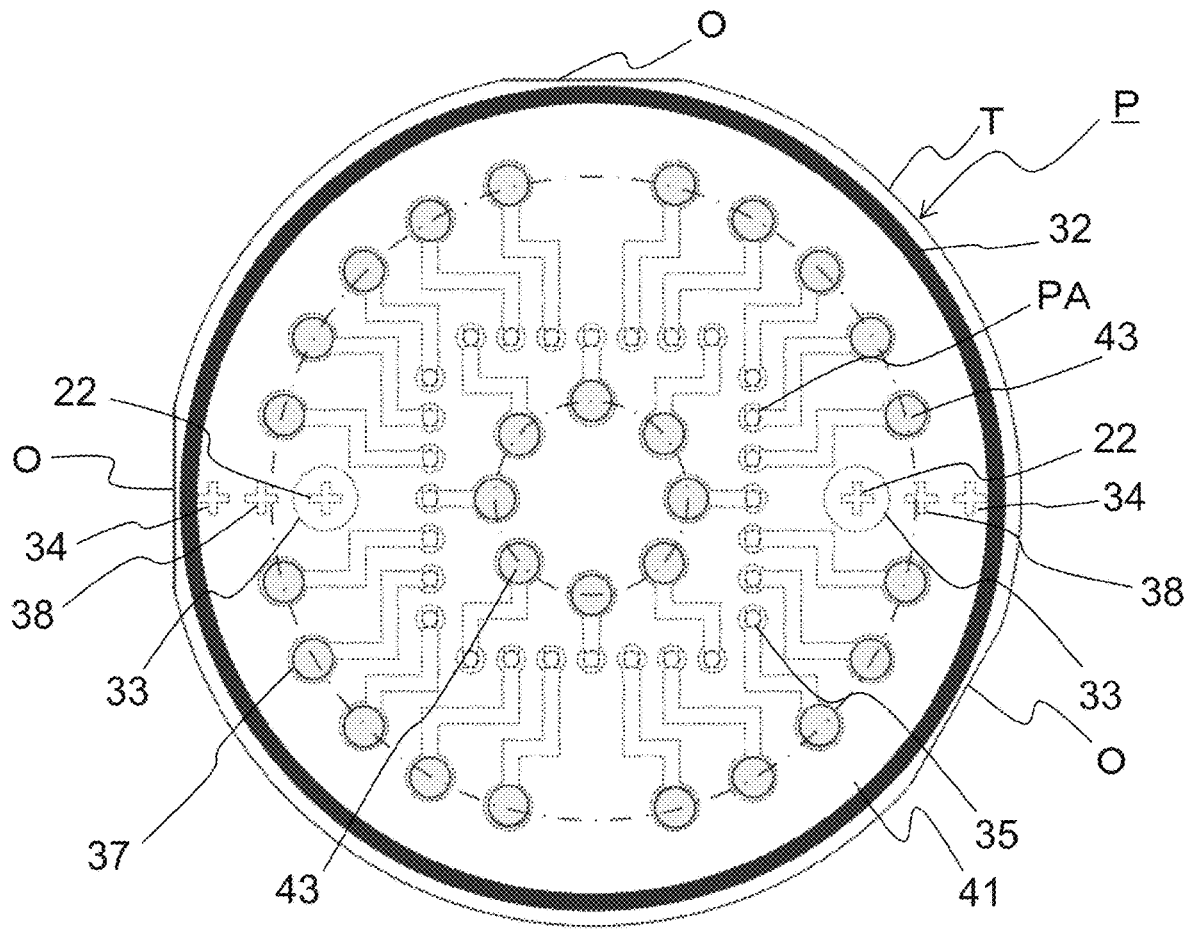
FIG. 15 is a diagram showing a state in which the solder balls of the above-described wafer packaging method are mounted, in which (a) is a cross-sectional view, and (b) is a plan view.
Figure 15B:
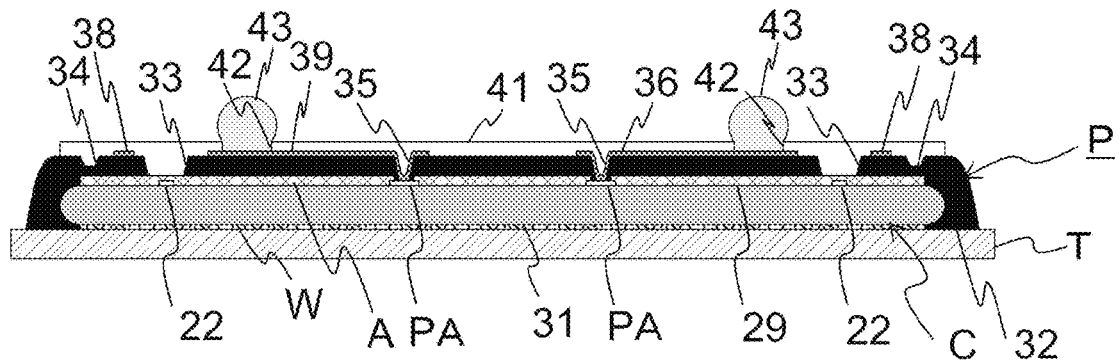

Subsequently, a flux (not shown) is applied to the surface of the semiconductor chip C, and then, positional alignment in the X, Y and θ directions with the mask where the solder balls 43 pass is performed by using the pattern of the contact holes 42 formed on the solder resist layer 41, that is, using the hole pattern as a benchmark. Next, as shown in FIGS. 15(a) and 15(b), the solder balls 43 having a diameter of 0.4 mm, for example, are mounted on the respective contact holes 42 in the solder resist layer 41 on the surface of the semiconductor chip C, and then the solder balls 43 are heat treated and parts of the respective solder balls 43 are melted thereby electrically connecting to the Cu redistribution layer 39 on the semiconductor chip C. As a result, the semiconductor chip C having an outer diameter of half inch size is a die attach type BGA (Ball grid array) type semiconductor package P packaged on a package substrate T having an outer diameter of 13.5 mm.

<Advantageous Effects>

The wafers W having an outer diameter of 12.5 mm and the package substrate T having an outer diameter of 13.5 mm, which are applied to the minimal fabrication concept, are each relatively small in size. Therefore, in order to accurately mount and package the wafers W on which the semiconductor A is formed on the package substrate T, it is necessary to make the thickness and the size of the wafers W and the package substrate T uniform. However, in manufacturing the wafers W and the package substrate T, it is very difficult to make the thickness and the size of the wafers W and the package substrate T uniform, and there is a possibility that variation occurs between the individual wafers W and the package substrate T.

In the step of mounting the wafers W on the package substrate T, the wafers W can be accurately mounted on the package substrate T by positional alignment of the wafers W by using the D-cuts O formed on the outer edge of the package substrate T and the first alignment marks 22 on the wafers W as benchmarks, so that accurate mounting of the wafer W on the substrate appears. However, in the step of packaging the wafers W mounted on the package substrate T, the mold resin layer 32 is formed so as to cover the wafers W on the package substrate T, so that the first alignment marks 22 are covered with the mold resin layer 32 and become visually recognizable.

In this case, for example, positional alignment is performed by using the D-cuts O of the package substrate T as benchmarks and the contact holes 35 may be formed in the mold resin layer 32 on the wafers W. However, as described above, the package substrate T may be varied in thickness and size. Therefore, in the case where the contact hole 35 is formed in the mold resin layer 32 by using the D-cuts O of the package substrate T as benchmarks instead of the first alignment marks 22 on the wafers W, there is a possibility that the contact holes 35 cannot be formed accurately due to variations in the thickness and the size of the package substrate T.

Therefore, in the method of manufacturing a semiconductor package according to the first embodiment, the wafers W is mounted on the package substrate T, the mold resin layer 32 is formed on the wafers W, and after the first alignment marks 22 becomes invisible, a part of the mold resin layer 32 on the first alignment marks 22 is removed to make the first alignment marks 22 visually recognizable. Further, using the first alignment marks 22 which have been made visually recognizable as benchmarks, the second alignment marks 34 which serve as benchmarks when performing the process after this step are formed in the mold resin layer 32.

Therefore, the second alignment marks 34 can be formed on the mold resin layer 32 by using the first alignment marks 22 which are visually recognizable as benchmarks before forming the mold resin layer 32. As a result, the second alignment marks 34 can be formed accurately.

Further, in the step of forming the contact holes 35 in the mold resin layer 32, positional alignment can be performed by using the first alignment marks 22 which have become visually recognizable as benchmarks, so that these contact holes 35 can be formed accurately. In the step of patterning the Cu film 36 formed on the mold resin layer 32 to form the Cu redistribution layer 39, positional alignment can be performed by using to the shoulders of the second alignment marks 34 which are visually recognizable even in this state as benchmarks, so that the Cu redistribution layer 39 can be formed accurately Further, when the Cu film 36 is patterned to form the Cu redistribution layer 39, the Cu film 36 is patterned by using the second alignment marks 34 as benchmarks to form the third alignment marks 38. As a result, even in a state where the solder resist layer 41 is formed so as to cover the Cu redistribution layer 39 and the first through third alignment marks 22, 34, 38, contact holes 42 that conduct to the Cu redistribution layer 39 by using the second or third alignment marks 34, 38 as benchmarks can be formed in the solder resist layer 41. Therefore, these contact holes 42 can be formed accurately.

As described above, a pattern of the Cu redistribution layer 39 which is conducted to the pad portions PA can be formed on the wafers W by using the second alignment marks 34 which are formed accurately by using the first alignment marks 22 as benchmarks. Therefore, positional alignment until the wafers W is mounted and packaged on the package substrate T can be accurately performed.

Further, a mold resin layer 32 is formed on the wafer W attached to the package substrate T, a part of the mold resin layer 32 is removed, and when the first alignment mark 22 is visually recognizable, the contact holes 35 are formed in the mold resin layer 32 by using the first alignment marks 22 as benchmarks. As a result, compared to a case where the contact holes 35 are formed by using the second alignment marks 34 as benchmarks, the first alignment marks 22 are originally formed on the wafers W, and thus it is possible to form the contact holes 35 accurately.

In addition, in a state in which the Cu film 36 is covered on the mold resin layer 32 and the first alignment marks 22 are not visually recognizable, the Cu film 36 is patterned by using the second alignment marks 34 formed in the mold resin layer 32 as benchmarks to form the Cu redistribution layer 39 and the third alignment marks 38. As a result, the Cu redistribution layer 39 and the third alignment marks 38 can be formed accurately, as compared with the case where the Cu redistribution layer 39 and the third alignment marks 38 are formed by using the D-cuts O of the package substrate T, which may vary in size and thickness, as benchmarks.

Further, the second alignment marks 34 and the contact holes 35 can be formed by a single step of irradiating laser light scanning over the mold resin layer 32, that is, by a single step of laser via machining, by using the first alignment marks 22 as benchmarks and thus the second alignment marks 34 and the contact holes 35 can be formed in the same step. As a result, the number of laser ablation steps can be reduced by one, and the process of forming the second alignment marks 34 and the contact holes 35 may be simplified. Further, compared to a case where the second alignment marks 34 and the contact holes 35 are separately formed by applying laser ablation twice, the positional relationship between the second alignment marks 34 and the contact holes 35 can be made more accurately.

In addition, the D-cuts O formed by cutting a part of the outer circumference of the package substrate T having a disk shape along a straight line are used as orientation flats for positional alignment. Therefore, since the package substrate T is larger than the wafer W, when the wafers W is mounted on the package substrate T, the D-cuts O are reliably positioned at positions outside the wafer W. Therefore, positional alignment of the wafers W and the package substrate T can be performed accurately and reliably aligned with each other by using the D-cuts O and the first alignment marks 22 as benchmarks. Further, by forming the wafer W having a disk shape of an outer diameter of 12.5 mm and forming a package substrate T having disk-shaped and an outer diameter of 13.5 mm, the wafer W and the package substrate T used in the so-called minimal fabrication system is achieved.

Second Embodiment

Figure 16:
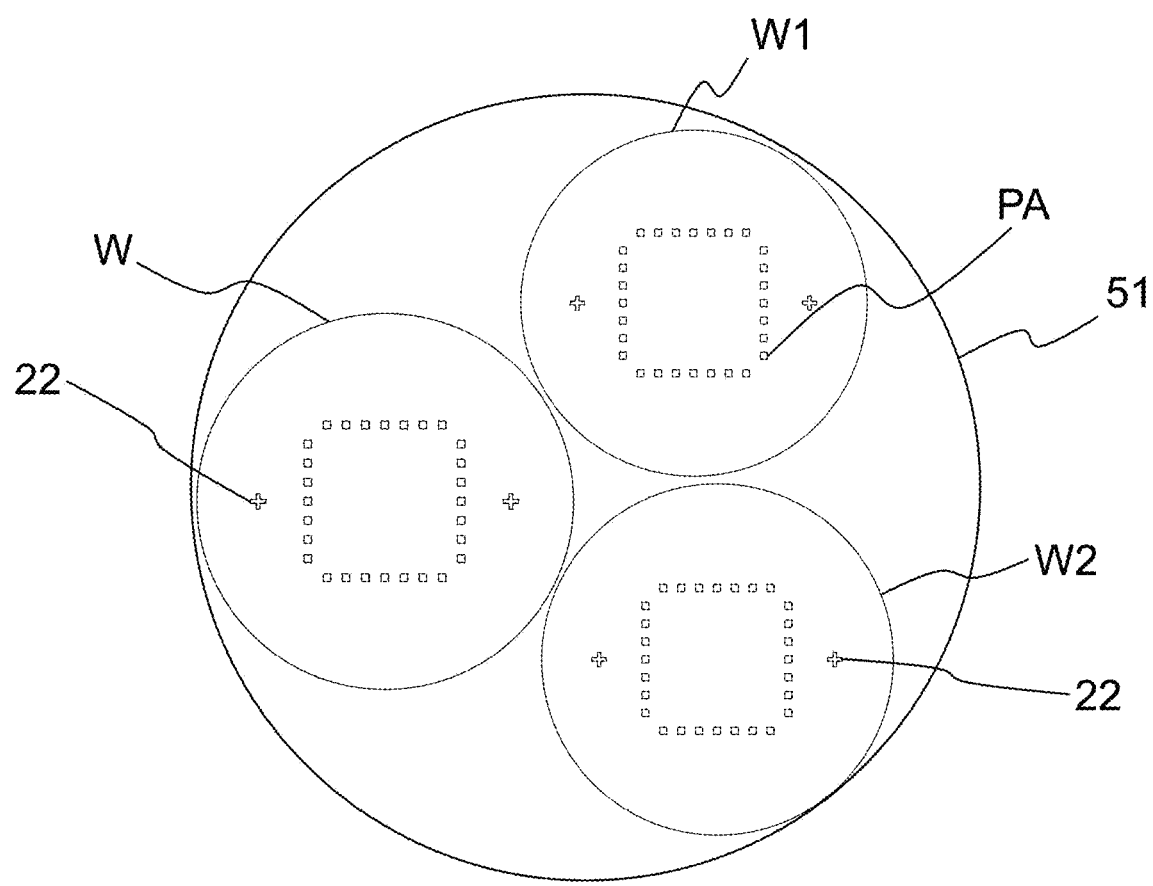
FIG. 16 is a plan view showing a wafer used in a wafer packaging method according to a second embodiment of the present invention.
Figure 17:
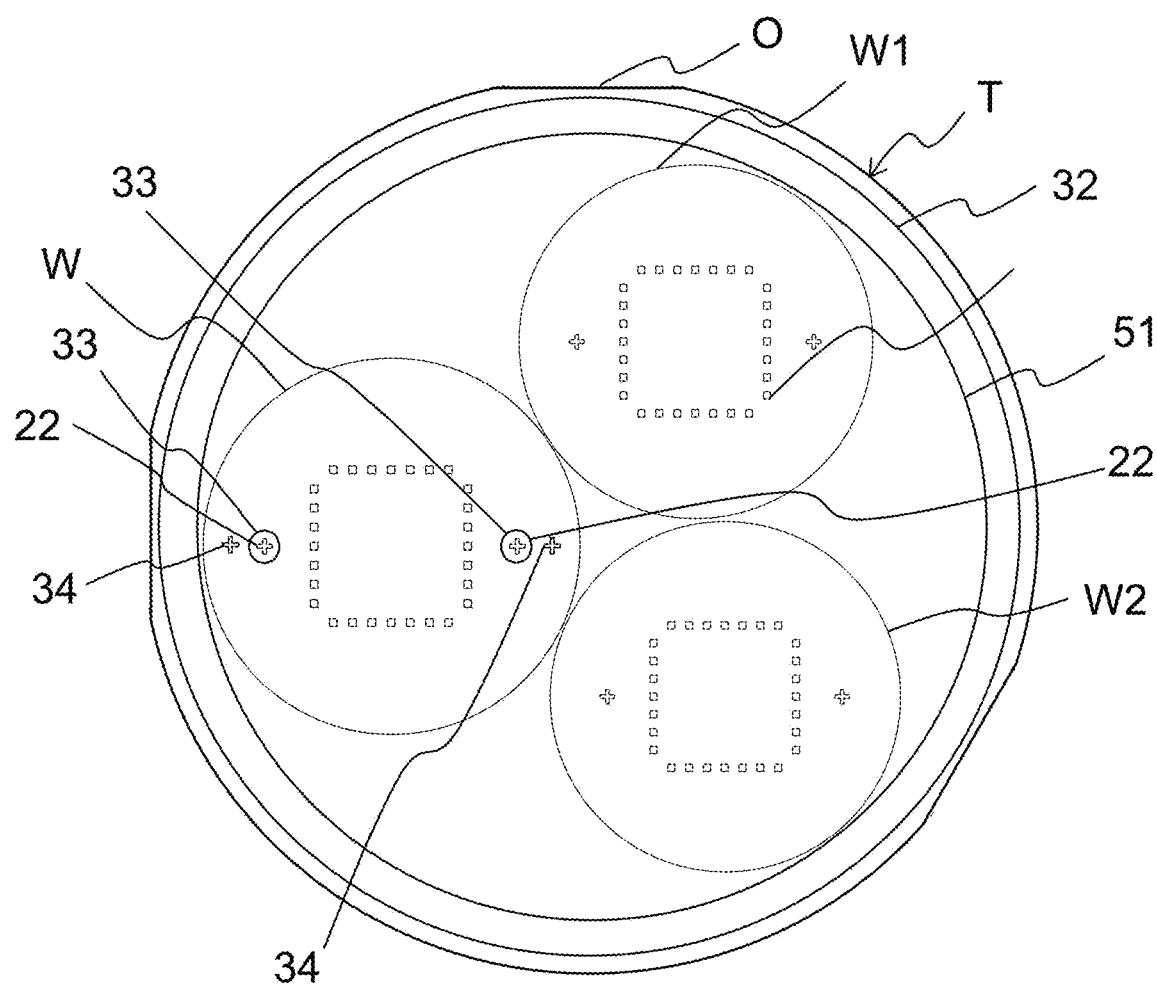
FIG. 17 is a plan view showing a state after the first laser ablation step in the above-described wafer packaging method.

Referring next to FIG. 16 and FIG. 17, the board according to a second embodiment of the present invention will be described.

In the semiconductor chip C according to the second embodiment, as shown in FIG. 16, a plurality of, for example, three wafers W, W1, W2 having a circular outer shape are disposed at predetermined positions on a base substrate 51 made of a metal, and positional information of the first alignment marks 22 on each of the wafers W, W1, W2 are stored in a computer or the like in advance.

As a result, only by removing a part of the mold resin layer 32 covering at least one of the wafers W and making the first alignment marks 22 visually recognizable, the second alignment marks 34 can be formed on the mold resin layer 32 by using the first alignment marks 22 formed on one of the wafers W as benchmarks in a state before the mold resin layer 32 is formed, as shown in FIG. 17.

Since the positional information of the first alignment marks 22 of each of the plurality of wafers W, W1, W2 is accurately stored, the Cu redistribution layer 39 for each of the wafers W, W1, W2 can be formed on the mold resin layer 32 by using only the second alignment marks 34 formed on the wafer W as benchmarks. Therefore, by only using the first alignment marks 22 of at least one of the wafers W, W1 and W2, positional alignment until each of the plurality of wafers W, W1, W2 is mounted and packaged on the package substrate T can be performed accurately.

Third Embodiment

Next, a third embodiment according to the present invention will be described with reference to FIGS. 18 and 19.

Figure 18:
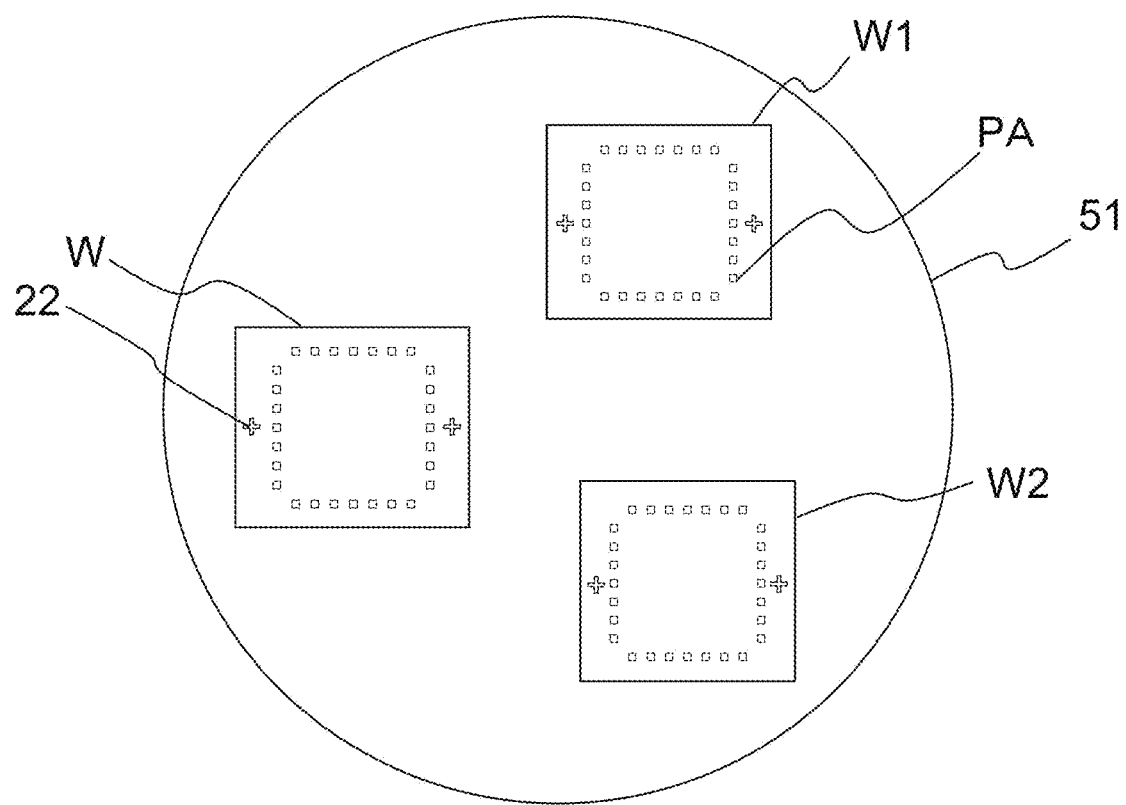
FIG. 18 is a plan view showing a wafer used in a wafer packaging method according to a third embodiment of the present invention.

The semiconductor chip C according to the third embodiment is different from the semiconductor chip C according to the second embodiment in that, as shown in FIG. 18, a plurality of, for example, three wafers W, W1, W2 having a square outer shape are provided in a predetermined positions on the base substrate 51, and the positional information of the first alignment marks 22 of the plurality of wafers W, W1, W2 are stored in advance in a computer or the like.

Figure 19:
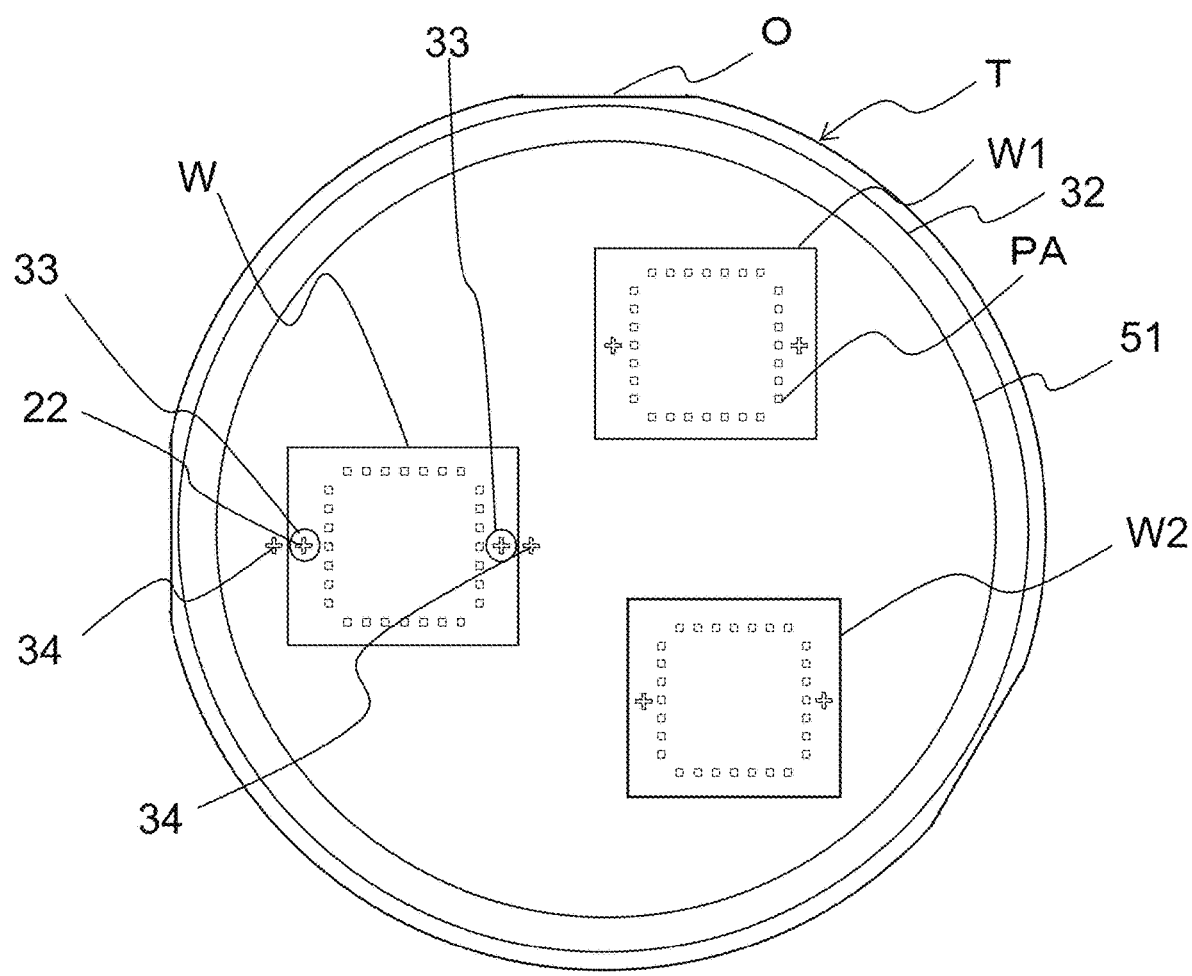
FIG. 19 is a plan view showing a state after the first laser ablation step in the above-described wafer packaging method.

As a result, as in the second embodiment, a part of the mold resin layer 32 covering at least one of the wafers W is removed so that the first alignment marks 22 become visually recognizable, whereby a second alignment marks 34 can be formed on the mold resin layer 32 by using the alignment marks 22 formed on one of the wafers W in a state before forming the mold resin layer 32 as benchmarks, as shown in FIG. 19.

Fourth Embodiment

Figure 20:
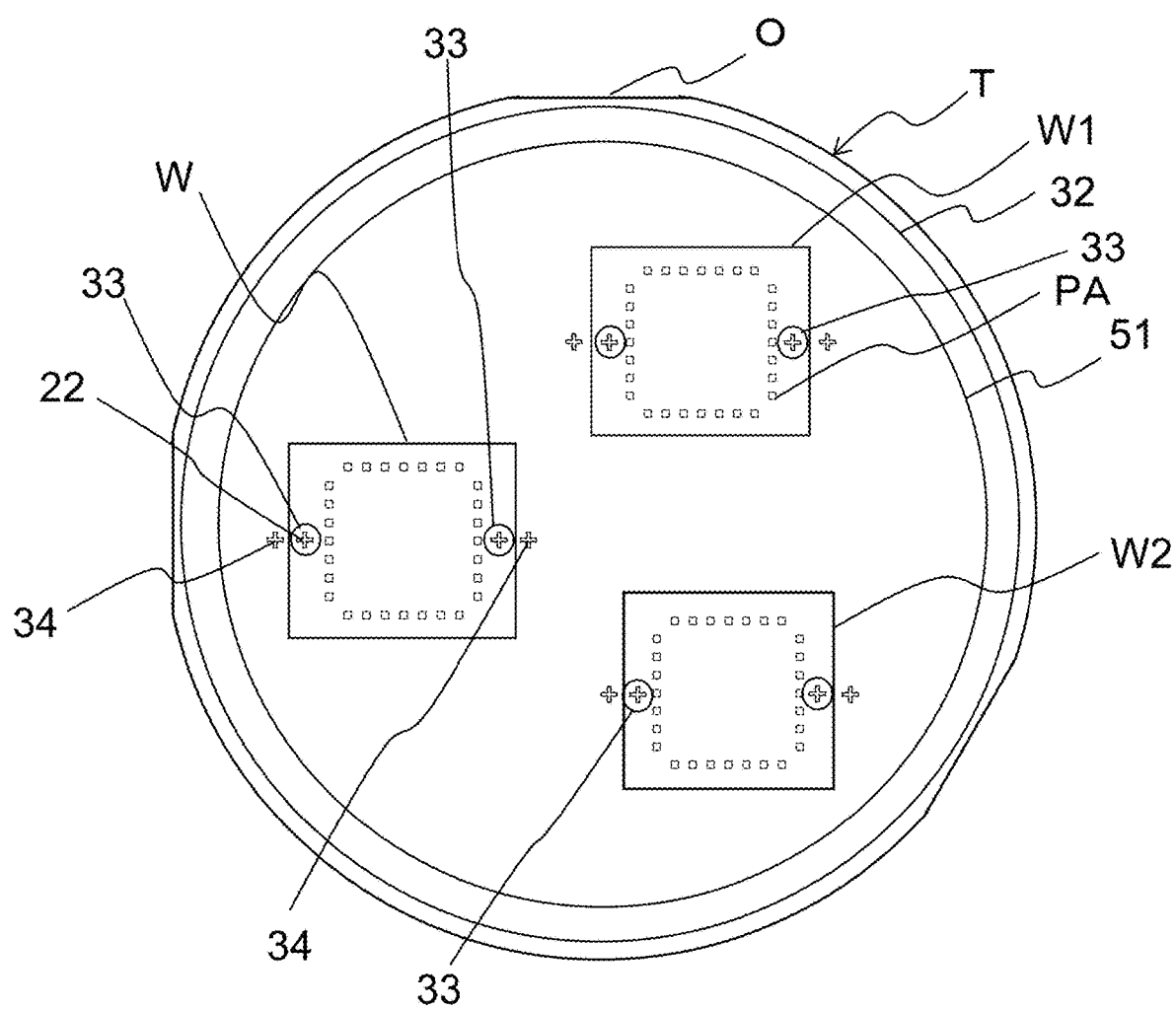
FIG. 20 is a plan view showing a state after the first laser ablation step in the wafer packaging method according to a fourth embodiment of the present invention.

Further, unlike the third embodiment, as in the fourth embodiment shown in FIG. 20, part of the mold resin layer 32 covering each of the wafers W, W1 and W2 may be removed to make the first alignment marks 22 visually recognizable, and the second alignment marks 34 may be formed on the mold resin layers 32 of the respective wafers W, W1 and W2 by using the first alignment marks 22 formed on the wafers W, W1 and W2 before forming the mold resin layer 32 as benchmarks.

<Others>

In each of the embodiments described above, the method of manufacturing the semiconductor package using a wafers W having a half inch size (diameter: 12.5 mm) and a package substrate T having an outer diameter of 13.5 mm, which is suitable for the minimal fabrication concept is provided. However, the present invention is not limited thereto, and a method of manufacturing a semiconductor package using, for example, an one inch wafer or a package substrate having a size other than 13.5 mm in outer diameter may also be used. Further, the semiconductor package is not limited to the BGA type semiconductor package P of the die attach type in which the semiconductor chip C having a half inch size is packaged on a package substrate T having an outer diameter of 13.5 mm, and may also be used in a semiconductor package having another package structure such as a flip chip type BGA or the like.

Further, in the second embodiment, the semiconductor chip C in which the plurality of wafers W, W1, W2 having a circular outer shape are provided on the base substrate 51 is used as the semiconductor chip C, and in the third and fourth embodiments described above, a plurality of wafers W, W1, W2 having a square outer shape are provided on the base substrate 51, but the outer shapes of the wafers W, W1, W2 provided on the base substrate 51 are not limited to a circular shape or a square shape.

REFERENCE SIGNS LIST 1 semiconductor manufacturing system
2 housing
2a upper apparatus portion
2b lower apparatus portion
2c operation panel
2d front chamber
2e docking port
3 semiconductor chip manufacturing apparatus
4 unit processing apparatus group (preceding process)
5 semiconductor package device
6 unit processing apparatus group (following process)
7 shuttle (for preceding process)
8 shuttle (for following process)
9 PLAD system
10 unit processing apparatus
10A unit processing apparatus (for preceding process)
10B unit processing apparatus (for following process)
11 processing apparatus main body
21 photoresist
22 first alignment mark
23 SiO 2 layer
24 impurity diffusion agent
25 diffusion region p +
26 gate oxide film
27 contact hole
28 Al layer
29 passivation film
31 Ag paste
32 mold resin layer
33 through hole
34 second alignment mark
35 contact hole
36 Cu film
37 photoresist
38 third alignment mark
39 Cu redistribution layer (wiring pattern)
41 solder resist layer
42 contact hole
43 solder ball
51 base substrate
W, W1 and W2 wafer
A semiconductor
C semiconductor chip
T package substrate (substrate)
P semiconductor package
m support portion
G gate electrode
S source electrode
D drain electrode
PA pad portion
O D-cut (positioning portion)

The invention claimed is:

1. A method of manufacturing a semiconductor package for packaging a wafer including a first alignment mark and a pad portion formed on an upper surface thereof on a substrate having a larger outer shape than the wafer and including a positioning portion for positional alignment at an outer edge, the method comprising:
a mounting step of mounting the wafer on the substrate by using the first alignment mark and the positioning portion as benchmarks;
a resin layer forming step of forming a resin layer on the wafer in a state where the positioning portion is exposed;
a removing step of removing a part of the resin layer by using the positioning portion exposed from the resin layer as a benchmark to make the first alignment mark visually recognizable;
a mark forming step of forming a second alignment mark on the resin layer by using the first alignment mark as a benchmark; and
a wiring pattern forming step of forming a wiring pattern to be conducted to the pad portion on the resin layer by using the second alignment mark as a benchmark.

2. The method of manufacturing a semiconductor package according to claim 1, wherein
the wiring pattern forming step includes forming a contact hole for exposing the pad portion on the resin layer by using the first alignment mark as a benchmark, and then forming the wiring pattern to be conducted to the pad portion through the contact hole by using the second alignment mark as a benchmark.

3. The method of manufacturing a semiconductor package according to claim 2, wherein
the mark forming step and the wiring pattern forming step form the second alignment mark and the contact hole by using laser light.

4. The method of manufacturing a semiconductor package according to claim 1, wherein
the substrate has a disk shape, and
the positioning portion is formed by cutting part of an outer periphery of the substrate along a straight line.

5. The method of manufacturing a semiconductor package according to claim 1, wherein
the wafer has a disk shape having an outer diameter of 12.5 mm, and
the substrate has a disk shape having an outer diameter of 13.5 mm.

6. The method of manufacturing a semiconductor package according to claim 2, wherein
the substrate has a disk shape, and
the positioning portion is formed by cutting part of an outer periphery of the substrate along a straight line.

7. The method of manufacturing a semiconductor package according to claim 3, wherein
the substrate has a disk shape, and
the positioning portion is formed by cutting part of an outer periphery of the substrate along a straight line.

8. The method of manufacturing a semiconductor package according to claim 2, wherein
the wafer has a disk shape having an outer diameter of 12.5 mm, and
the substrate has a disk shape having an outer diameter of 13.5 mm.

9. The method of manufacturing a semiconductor package according to claim 3, wherein
the wafer has a disk shape having an outer diameter of 12.5 mm, and
the substrate has a disk shape having an outer diameter of 13.5 mm.

10. The method of manufacturing a semiconductor package according to claim 4, wherein
the wafer has a disk shape having an outer diameter of 12.5 mm, and
the substrate has a disk shape having an outer diameter of 13.5 mm.

11. The method of manufacturing a semiconductor package according to claim 6, wherein the wafer has a disk shape having an outer diameter of 12.5 mm, and the substrate has a disk shape having an outer diameter of 13.5 mm.

12. The method of manufacturing a semiconductor package according to claim 7, wherein the wafer has a disk shape having an outer diameter of 12.5 mm, and the substrate has a disk shape having an outer diameter of 13.5 mm.

13. A method of manufacturing a semiconductor package for packaging a plurality of wafers disposed on a base substrate including a first alignment mark and a pad portion formed on an upper surface thereof on a substrate having a larger outer shape than the base substrate and including a positioning portion for positional alignment at an outer edge, the method including:

a mounting step of mounting the plurality of wafers on the substrate by using the first alignment mark and the positioning portion of at least one of the plurality of wafers as benchmarks;

a resin layer forming step of forming a resin layer on the plurality of wafers in a state where the positioning portion is exposed;

a removing step of making the first alignment mark of at least one of the plurality of wafers visually recognizable by removing a part of the resin layer by using the positioning portion exposed from the resin layer as a benchmark;

a mark forming step of forming a second alignment mark on the resin layer by using the first alignment mark as a benchmark; and a wiring pattern forming step of forming a wiring pattern to be conducted to the pad portion of the one wafer on the resin layer by using the second alignment mark as a benchmark.

14. A semiconductor package comprising:

a wafer including a pad portion;

a first alignment mark formed on an upper surface of the wafer;

a substrate including a positioning portion for positioning provided on an outer edge thereof and the wafer packaged on an upper surface thereof, and having an outer shape larger than that of the wafer;

a resin layer formed on the wafer such that the positioning portion is exposed and the first alignment mark is visually recognizable;

a second alignment mark formed on the resin layer; and a wiring pattern formed on the resin layer and electrically connected to the pad portion.

15. A semiconductor package comprising:

a base substrate;

a plurality of wafers, each having a pad portion, disposed side by side on the base substrate, each of the plurality of wafers being packaged on an upper surface of the base substrate;

a first alignment mark formed on an upper surface of each of the plurality of wafers;

a substrate including a positioning portion for positioning provided on an outer edge thereof, the base substrate being disposed on an upper surface of the substrate, the substrate having an outer shape larger than that of the base substrate;

a resin layer formed on the plurality of wafers in a state in which the positioning portion is exposed and the first alignment mark of each of the plurality of wafers is visually recognizable;

a second alignment mark formed on the resin layer; and on each of the plurality of wafers, a wiring pattern formed on the resin layer and electrically connected to the pad portion.

* * * * *